United States Patent
Kim

(10) Patent No.: US 11,442,679 B2
(45) Date of Patent: Sep. 13, 2022

(54) DISPLAY DEVICE

(71) Applicant: LG ELECTRONICS INC., Seoul (KR)

(72) Inventor: Hyunseung Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 262 days.

(21) Appl. No.: 16/796,027

(22) Filed: Feb. 20, 2020

(65) Prior Publication Data

US 2021/0182008 A1 Jun. 17, 2021

(30) Foreign Application Priority Data

Dec. 13, 2019 (WO) ................ PCT/KR2019/017741

(51) Int. Cl.
| | | |
|---|---|---|
| G06F 3/00 | (2006.01) | |
| G06F 3/14 | (2006.01) | |
| G10L 15/22 | (2006.01) | |
| B65H 75/44 | (2006.01) | |
| G05B 15/02 | (2006.01) | |
| H05K 5/00 | (2006.01) | |
| H05K 5/02 | (2006.01) | |

(52) U.S. Cl.
CPC .......... G06F 3/14 (2013.01); B65H 75/4471 (2013.01); B65H 75/4486 (2013.01); G05B 15/02 (2013.01); G10L 15/22 (2013.01); H05K 5/0017 (2013.01); H05K 5/0217 (2013.01); *G10L 2015/223* (2013.01)

(58) Field of Classification Search
CPC .......... G09F 9/301; G06F 3/167; G09G 5/003
See application file for complete search history.

(56) References Cited

U.S. PATENT DOCUMENTS

| | | | |
|---|---|---|---|
| 10,015,435 B2 | 7/2018 | Kim et al. | |
| 10,360,876 B1* | 7/2019 | Rahman | G06F 3/1423 |
| 10,452,156 B2 | 10/2019 | Kang et al. | |
| 2013/0332172 A1* | 12/2013 | Prakash | H04M 1/72412 704/270.1 |
| 2015/0348496 A1* | 12/2015 | Santos, II | G06F 3/04842 345/520 |
| 2016/0306534 A1* | 10/2016 | Woo | G09G 3/035 |
| 2017/0103735 A1* | 4/2017 | Oh | G09G 5/391 |
| 2019/0064883 A1 | 2/2019 | Hong et al. | |
| 2019/0286194 A1* | 9/2019 | Xia | G06F 1/1652 |
| 2019/0385376 A1* | 12/2019 | Kim | G06F 3/04815 |
| 2020/0226971 A1* | 7/2020 | Yi | G09G 5/38 |

FOREIGN PATENT DOCUMENTS

| | | |
|---|---|---|
| KR | 10-2007-0097007 A | 10/2007 |
| KR | 10-2017-0038308 A | 4/2017 |
| KR | 10-2017-0050270 A | 5/2017 |
| KR | 10-2019-0129024 A | 11/2019 |

* cited by examiner

*Primary Examiner* — Daniel Abebe
(74) *Attorney, Agent, or Firm* — Birch, Stewart, Kolasch & Birch, LLP

(57) ABSTRACT

A display device including a housing; a rotatable roller accommodated in the housing; a rollable display adjusted in a drawn-out length from the housing according to rotation of the roller; and a controller configured to receive an input of a voice command, and vary a method of outputting a result of the voice command according to the drawn-out length of the rollable display.

20 Claims, 27 Drawing Sheets

(a) Find L video on YouTube

Screen size is adjusted to play YouTube video
Say full screen if you want to change to full screen (b) Find L video on YouTube (c) Find L video on YouTube

DISPLAY DEVICE

CROSS-REFERENCE TO RELATED APPLICATION

Pursuant to 35 U.S.C. § 119(a), this application claims the benefit of earlier filing date and right of priority to PCT International Application No. PCT/KR2019/017741 filed on Dec. 13, 2019, the contents of which are hereby incorporated by reference herein in its entirety.

BACKGROUND OF THE INVENTION

Field of the Invention

The present disclosure relates to a display device, and more particularly, to a display device having a bendable display.

Discussion of the Related Art

A display device has a function of receiving, processing, and displaying an image to be viewed by a user. For example, the display device receives a broadcast signal selected by a user among broadcast signals transmitted from a broadcasting station, separates an image signal from the received signal, and re-displays the separated image signal on a display.

Recently, by virtue of development of broadcasting technology and network technology, a function of a display device has been significantly diversified and accordingly the performance of the device has also been enhanced. That is, the display device has developed to provide various different contents as well as simply broadcast content to a user. For example, the display device can provide gameplay, listening to music, Internet shopping, user customized information, or the like using various applications as well as programs received from a broadcasting station. In order to perform such extended functions, the display device is basically connected to other devices or networks using various communication programs and provides a ubiquitous computing environment to a user. That is, the display device has evolved to a smart device for achieving connectivity to a network and ubiquitous computing.

In addition, displays which can be significantly deformed with sufficient elasticity have been developed. Such displays cancan be bendable or foldable, and accordingly, display devices cancan have a more compact structure. The display device cancan operate in a zero view mode in which the display is entirely drawn into a housing, a partial view mode in which the display is partially drawn out from the housing, or a full view mode in which the display is entirely drawn out from the housing.

SUMMARY OF THE INVENTION

An aspect of the present disclosure is directed to providing a display device that minimizes a time required to provide a result of a voice command to a user.

Another aspect of the present disclosure is directed to providing a display device that minimizes driving of a display for displaying a result of a voice command.

A display device according to an embodiment of the present disclosure comprises a housing, a rotatable roller accommodated in the housing, a display adjusted in a drawn-out length from the housing according to rotation of the roller, and a controller configured to differently control a result of a voice command according to the drawn-out length when the voice command is received.

According to an embodiment of the present disclosure, there is an advantage of minimizing a time required for providing a result of a voice command to a user. There also is an advantage that a result for a voice command can be immediately provided without additional driving when the voice command is received. Further, there is an advantage in that the voice command and the result of the voice command can be more accurately provided to the user.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Hereinafter, embodiments relating to the present disclosure will be described in detail with reference to the accompanying drawings. The suffixes "module" and "unit" for components used in the description below are assigned or mixed in consideration of easiness in writing the specification and do not have distinctive meanings or roles by themselves. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

Although the terms first, second, etc. can be used herein to describe various elements, these elements should not be limited by these terms. These terms are generally only used to distinguish one element from another.

When an element is referred to as being "connected with" another element, the element can be connected with the other element or intervening elements can also be present. In contrast, when an element is referred to as being "directly connected with" another element, there are no intervening elements present. A singular representation can include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps can likewise be utilized.

The display device described in this specification refers to a TV, a smart TV, a network TV, a hybrid broadcast broadband television (HBBTV), an Internet TV, a web TV, an Internet protocol television (IPTV), digital signage, a desktop computer, a smartphone, a laptop computer, a digital broadcast terminal, a personal digital assistant (PDA), a portable multimedia player (PMP), a navigation system, a slate PC, a tablet PC, an ultrabook, a wearable device, etc. Including a rollable display. Here, rollable display means that a display can be rolled in the form of a roll and can include a flexible display, a foldable display, etc. Therefore, the embodiments described in this disclosure can also be applied to smartphones or the like and mobile terminals having a rollable display or the like, as well as to smart TVs or the like.

Figure 1:
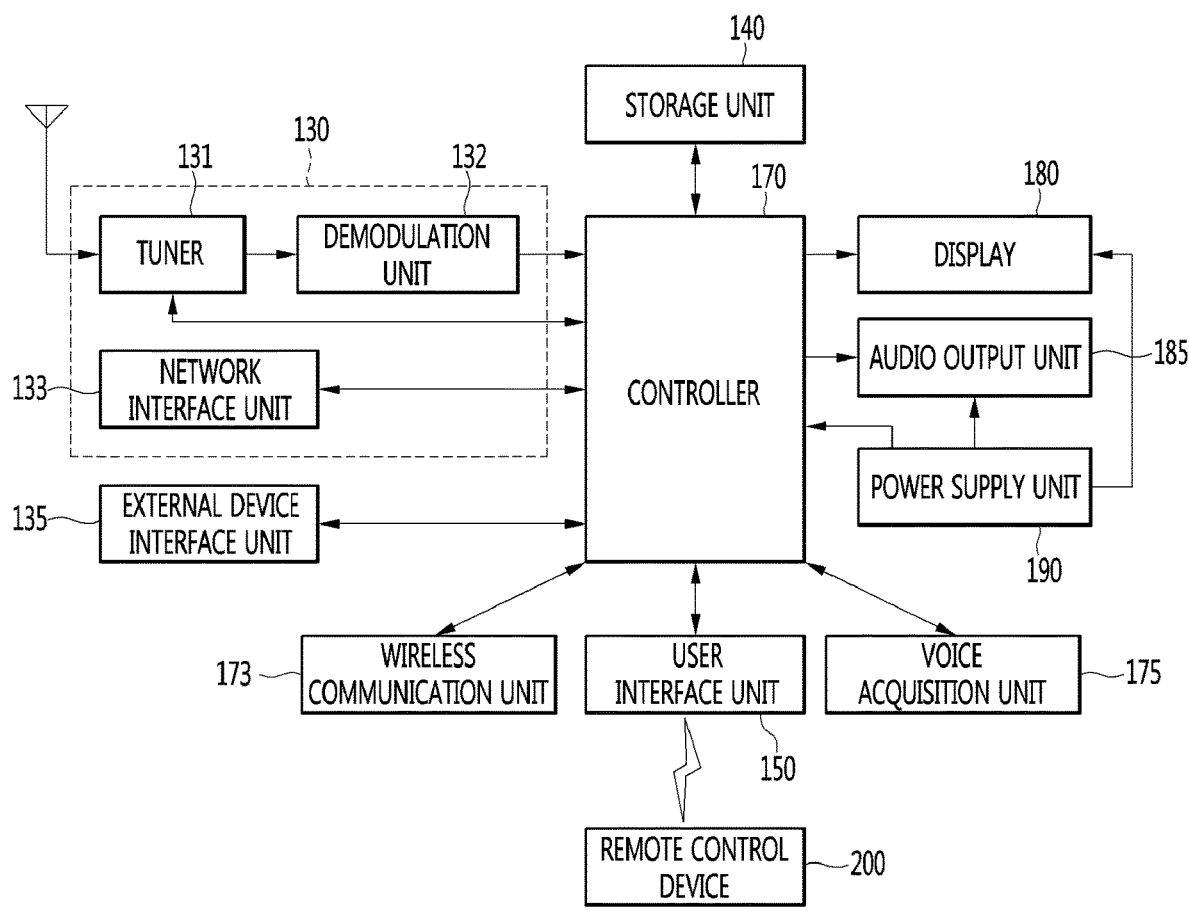
FIG. 1 is a block diagram illustrating a configuration of a display device according to an embodiment of the present disclosure.

FIG. 1 is a block diagram illustrating a configuration of a display device according to an embodiment of the present disclosure. Referring to FIG. 1, a display device 100 includes a broadcast reception unit 130, an external device interface unit 135, a storage 140, a user input interface unit 150, a controller 170, a wireless communication unit 173, a voice acquisition unit 175, a display 180, an audio output unit 185, and a power supply unit 190.

The broadcast reception unit 130 can include a tuner 131, a demodulation unit 132, and a network interface unit 133. The tuner 131 can select a specific broadcast channel according to a channel selection command, and can receive broadcast signals for the selected specific broadcast channel.

Further, the demodulation unit 132 can divide the received broadcast signals into video signals, audio signals, and broadcast program related data signals and restore the divided video signals, audio signals, and data signals to an output available form. Also, the network interface unit 133 provides an interface for connecting the display device 100 to a wired/wireless network including internet network. The network interface unit 133 can transmit or receive data to or from another user or another electronic device through an accessed network or another network linked to the accessed network.

In addition, the network interface unit 133 can access a predetermined webpage through an accessed network or another network linked to the accessed network. That is, the network interface unit 133 can transmit or receive data to or from a corresponding server by accessing a predetermined webpage through network. Then, the network interface unit 133 can receive contents or data provided from a content provider or a network operator. That is, the network interface unit 133 can receive contents such as movies, advertisements, games, VODs, and broadcast signals, which are provided from a content provider or a network provider, through network and information relating thereto.

Additionally, the network interface unit 133 can receive firmware update information and update files provided from a network operator and transmit data to an internet or content provider or a network operator. The network interface unit 133 can also select and receive a desired application among applications open to the air, through network.

Further, the external device interface unit 135 can receive an application or an application list in an adjacent external device and deliver it to the controller 170 or the storage 140. The external device interface 135 can also provide a connection path between the display device 100 and an external device. In addition, the external device interface 135 can receive at least one of image and audio output from an external device that is wirelessly or wiredly connected to the display device 100 and deliver it to the controller. The external device interface unit 135 can include a plurality of external input terminals. The plurality of external input terminals can include an RGB terminal, at least one High Definition Multimedia Interface (HDMI) terminal, and a component terminal.

An image signal of an external device input through the external device interface unit 135 can be output through the display 180. Also, a sound signal of an external device input through the external device interface unit 135 can be output through the audio output unit 185. An external device connectable to the external device interface unit 130 may be one of a set-top box, a Blu-ray player, a DVD player, a game console, a sound bar, a smartphone, a PC, a USB Memory, and a home theater system but this is just exemplary.

Additionally, some content data stored in the display device 100 can be transmitted to a user or an electronic device, which is selected from other users or other electronic devices pre-registered in the display device 100. The storage 140 can store signal-processed image, voice, or data signals stored by a program in order for each signal processing and control in the controller 170.

Additionally, the storage 140 can perform a function for temporarily store image, voice, or data signals output from the external device interface unit 135 or the network interface unit 133 and can store information on a predetermined image through a channel memory function. The storage 140 can also store an application or an application list input from the external device interface unit 135 or the network interface unit 133. Further, the display device 100 can play content files (for example, video files, still image files, music files, document files, application files, and so on) stored in the storage 140 and provide them to a user.

The user input interface unit 150 can deliver signals input from a user to the controller 170 or deliver signals from the controller 170 to a user. For example, the user input interface unit 150 can receive or process control signals such as power on/off, channel selection, and screen setting from the remote control device 200 or transmit control signals from the controller 170 to the remote control device 200 according to various communication methods such as Bluetooth, Ultra Wideband (WB), ZigBee, Radio Frequency (RF), and IR.

Additionally, the user input interface unit 150 can deliver, to the controller 170, control signals input from local keys such as a power key, a channel key, a volume key, and a setting key. Image signals that are image-processed in the controller 170 can be input to the display 180 and displayed as an image corresponding to corresponding image signals. Additionally, image signals that are image-processed in the controller 170 can be input to an external output device through the external device interface unit 135.

Voice signals processed in the controller 170 can be output to the audio output unit 185. Additionally, voice signals processed in the controller 170 can be input to an external output device through the external device interface unit 135.

Besides that, the control module 170 can control overall operations in the display device 100. Additionally, the controller 170 can control the display device 100 by a user command or internal program input through the user input interface unit 150 and download a desired application or application list into the display device 100 in access to network.

The controller 170 can output channel information selected by a user together with processed image or voice signals through the display 180 or the audio output unit 185. Additionally, according to an external device image playback command received through the user input interface unit 150, the controller 170 can output image signals or voice signals of an external device such as a camera or a camcorder, which are input through the external device interface unit 135, through the display 180 or the audio output unit 185.

Further, the controller 170 can control the display 180 to display images and control broadcast images input through the tuner 131, external input images input through the external device interface unit 135, images input through the network interface unit, or images stored in the storage 140 to be displayed on the display 180. In this instance, an image displayed on the display 180 can be a still image or video and also can be a 2D image or a 3D image.

Additionally, the controller 170 can play content stored in the display device 100, received broadcast content, and external input content input from the outside, and the content can be in various formats such as broadcast images, external input images, audio files, still images, accessed web screens, and document files. Further, the wireless communication unit 173 can perform a wired or wireless communication with an external electronic device. The wireless communication unit 173 can perform short-range communication with an external device. For this, the wireless communication unit 173 can support short-range communication by using at least one of Bluetooth™, Radio Frequency Identification (RFID), Infrared Data Association (IrDA), Ultra Wideband (UWB), ZigBee, Near Field Communication (NFC), Wireless-Fidelity (Wi-Fi), Wi-Fi Direct, and Wireless Universal Serial Bus (USB) technologies.

The wireless communication unit 173 can support wireless communication between the display device 100 and a wireless communication system, between the display device 100 and another display device 100, or between networks including the display device 100 and another display device 100 (or an external server) through wireless area networks. The wireless area networks can be wireless personal area networks.

Herein, the other display device 100 can be a mobile terminal such as a wearable device (for example, a smart watch, a smart glass, and a head mounted display (HMD)) or a smartphone, which is capable of exchanging data (or inter-working) with the display device 100. The wireless communication unit 173 can detect (or recognize) a communicable wearable device around the display device 100. Furthermore, if the detected wearable device is a device authenticated to communicate with the display device 100, the controller 170 can transmit at least part of data processed in the display device 100 to the wearable device through the wireless communication unit 173. Accordingly, a user of the wearable device can use the data processed in the display device 100 through the wearable device.

The voice acquisition unit 175 can acquire audio. For example, the voice acquisition unit 175 can include at least one microphone, and can acquire audio around the display device 100 through the microphone.

In addition, the display 180 can convert image signals, data signals, or OSD signals, which are processed in the controller 170, or images signals or data signals, which are received in the external device interface unit 135, into R, G, and B signals to generate driving signals. Furthermore, the display device 100 shown in FIG. 1 is just one embodiment of the present disclosure and thus, some of the components shown can be integrated, added, or omitted according to the specification of the actually implemented display device 100.

That is, if needed, two or more components can be integrated into one component or one component can be divided into two or more components and configured. Additionally, a function performed by each block is to describe an embodiment of the present disclosure and its specific operation or device does not limit the scope of the present disclosure.

According to another embodiment of the present disclosure, unlike FIG. 1, the display device 100 can receive images through the network interface unit 133 or the external device interface unit 135 and play them without including the tuner 131 and the demodulation unit 132. For example, the display device 100 can be divided into an image processing device such as a set-top box for receiving broadcast signals or contents according to various network services and a content playback device for playing contents input from the image processing device.

In this instance, an operating method of a display device according to an embodiment of the present disclosure described below can be performed by one of the display device described with reference to FIG. 1, an image processing device such as the separated set-top box, and a content playback device including the display 180 and the audio output unit 185. The audio output unit 185 receives the audio processed signal from the controller 170 and outputs the sound.

The power supply unit 190 supplies the corresponding power throughout the display device 100. In particular, the power supply unit 190 supplies power to the controller 170 that can be implemented in the form of a System On Chip (SOC), a display 180 for displaying an image, and the audio output unit 185 for outputting audio or the like. Specifically, the power supply unit 190 can include a converter for converting an AC power source into a DC power source, and a dc/dc converter for converting a level of the DC source power.

Figure 2:
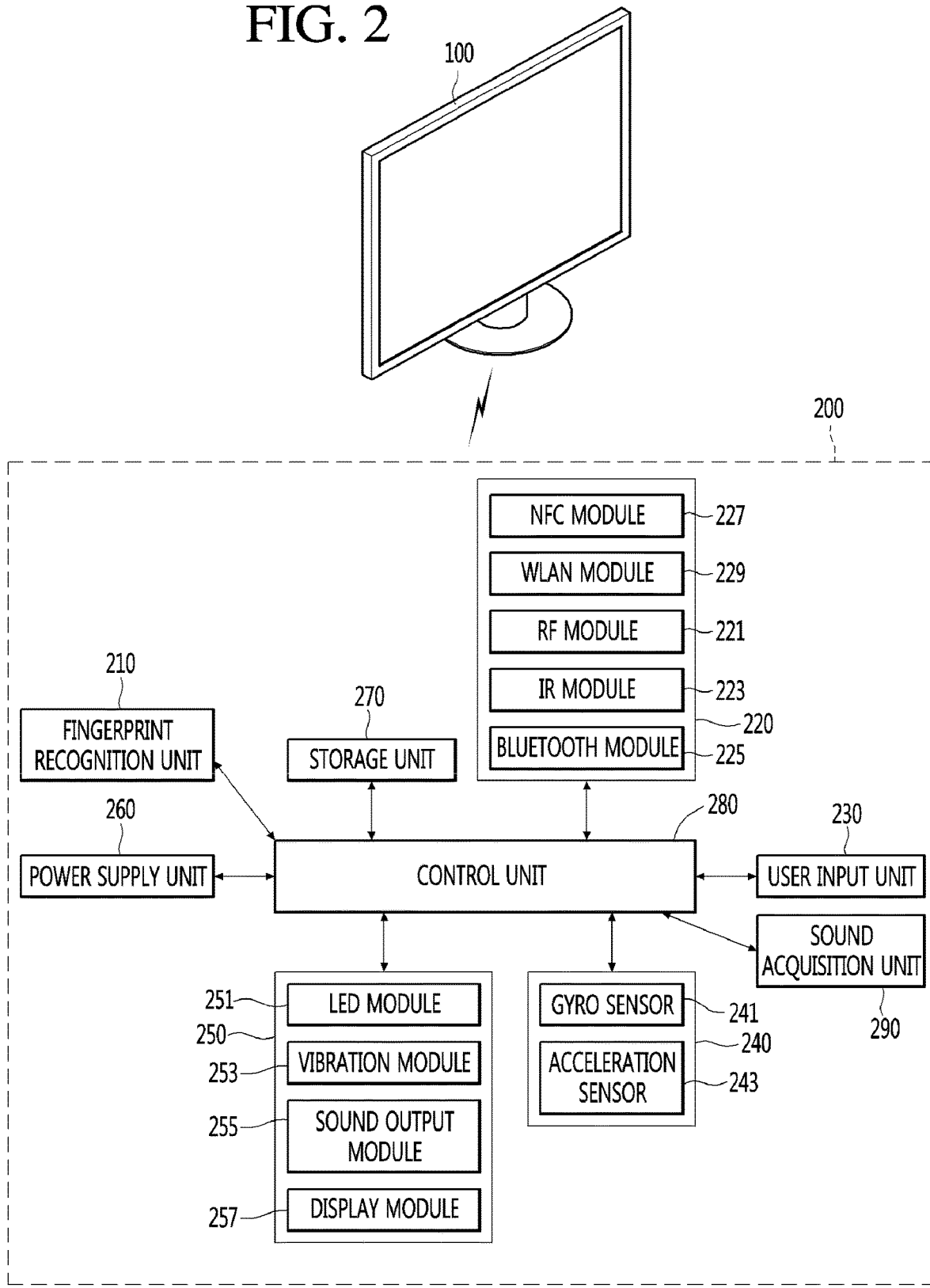
FIG. 2 is a block diagram illustrating a remote control device according to an embodiment of the present disclosure.
Figure 3:
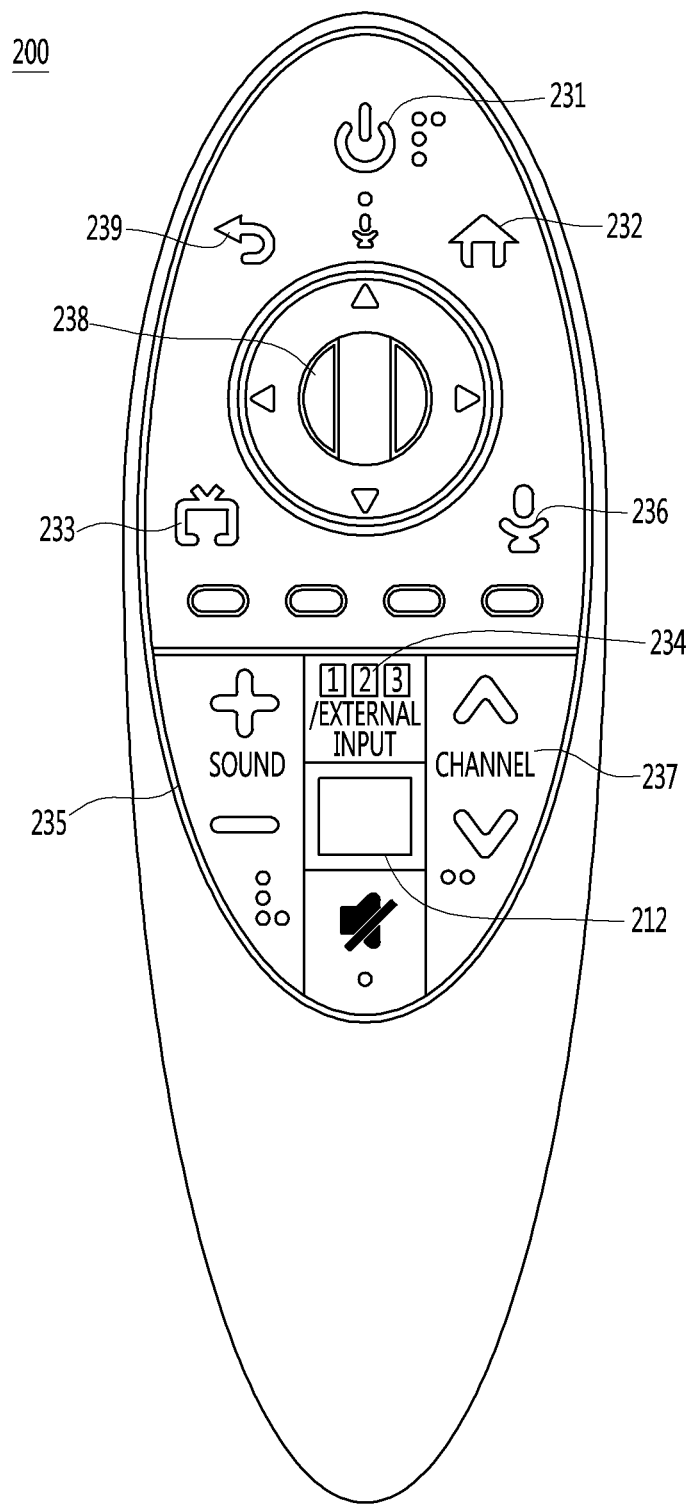
FIG. 3 is a view illustrating an actual configuration of a remote control device according to an embodiment of the present disclosure.

Next, referring to FIGS. 2 and 3, a remote control device is described according to an embodiment of the present disclosure. In particular, FIG. 2 is a block diagram illustrating a remote control device according to an embodiment of the present disclosure, and FIG. 3 is a view illustrating an actual configuration of a remote control device according to an embodiment of the present disclosure.

First, referring to FIG. 2, a remote control device 200 can include a fingerprint recognition unit 210, a wireless communication unit 220, a user input unit 230, a sensor unit 240, an output unit 250, a power supply unit 260, a storage unit 270, a controller (control unit) 280, and a voice (sound) acquisition unit 290. Referring to FIG. 2, the wireless communication unit 225 transmits/receives signals to/from an arbitrary any one of display devices according to the above-mentioned embodiments of the present disclosure.

The wireless communication unit can include an RF module 221 for transmitting/receiving signals to/from the display device 100 according to the RF communication standards and an IR module 223 for transmitting/receiving signals to/from the display device 100 according to the IR communication standards. Additionally, the wireless communication unit can include a Bluetooth module 225 for transmitting/receiving signals to/from the display device 100 according to the Bluetooth communication standards. Additionally, the wireless communication unit can include an NFC module 227 for transmitting/receiving signals to/from the display device 100 according to the Near Field Communication (NFC) communication standards and a WLAN module 229 for transmitting/receiving signals to/from the display device 100 according to the Wireless LAN (WLAN) communication standards.

Additionally, the remote control device 200 can transmit signals containing information on a movement of the remote control device 200 to the display device 100 through the wireless communication unit 220. Further, the remote control device 200 can receive signals transmitted from the display device 100 through the RF module 221 and if necessary, can transmit a command on power on/off, channel change, and volume change to the display device 100 through the IR module 223.

In addition, the user input unit 230 can be configured with a keypad button, a touch pad, or a touch screen. Thus, a user can manipulate the user input unit 230 to input a command relating to the display device 100 to the remote control device 200. If the user input unit 230 includes a hard key button, a user can input a command relating to the display device 100 to the remote control device 200 through the push operation of the hard key button. This will be described with reference to FIG. 3.

Referring to FIG. 3, the remote control device 200 can include a plurality of buttons including a fingerprint recognition button 212, a power button 231, a home button 232, a live button 233, an external input button 234, a voice adjustment button 235, a voice recognition button 236, a channel change button 237, a check button 238, and a back button 239.

The fingerprint recognition button 212 can be a button for recognizing a user's fingerprint. According to an embodiment of the present disclosure, the fingerprint recognition button 212 can perform a push operation and receive a push operation and a fingerprint recognition operation. In addition, the power button 231 can be a button for turning on/off the power of the display device 100, and the button 232 can be a button for moving to the home screen of the display device 100. The live button 233 can be a button for displaying live broadcast programs, and the external input button 234 can be a button for receiving an external input connected to the display device 100. Further, the voice adjustment button 235 can be a button for adjusting the size of a volume output from the display device 100, and the voice recognition button 236 can be a button for receiving a user's voice and recognizing the received voice. Also, the channel change button 237 can be a button for receiving broadcast signals of a specific broadcast channel, and the check button 238 can be a button for selecting a specific function and the back button 239 can be a button for returning to a previous screen.

Again, FIG. 2 is described. If the user input unit 230 includes a touch screen, a user can touch a soft key of the touch screen to input a command relating to the display device 100 to the remote control device 200. Additionally, the user input unit 230 can include various kinds of input mechanisms manipulated by a user, for example, a scroll key and a jog key, and this embodiment does not limit the scope of the present disclosure.

In addition, the sensor unit 240 can include a gyro sensor 241 or an acceleration sensor 243 and the gyro sensor 241 can sense information on a movement of the remote control device 200. For example, the gyro sensor 241 can sense information on an operation of the remote control device 200 based on x, y, and z axes and the acceleration sensor 243 can sense information on a movement speed of the remote control device 200. Further, the remote control device 200 can further include a distance measurement sensor and sense a distance with respect to the display 180 of the display device 100.

The output unit 250 can output image or voice signals corresponding to a manipulation of the user input unit 235 or corresponding to signals transmitted from the display device 100. A user can recognize whether the user input unit 235 is manipulated or the display device 100 is controlled through the output unit 250.

For example, the output unit 250 can include an LED module 251 for flashing, a vibration module 253 for generating vibration, a sound output module 255 for outputting sound, or a display module 257 for outputting an image, if the user input unit 235 is manipulated or signals are transmitted/received to/from the display device 100 through the wireless communication unit 225.

Additionally, the power supply unit 260 supplies power to the remote control device 200 and if the remote control device 200 does not move for a predetermined time, stops the power supply, so that power waste can be reduced. The power supply unit 260 can resume the power supply if a predetermined key provided at the remote control device 200 is manipulated.

The storage unit 270 can store various kinds of programs and application data necessary for a control or operation of the remote control device 200. If the remote control device 200 transmits/receives signals wirelessly through the display device 100 and the RF module 221, the remote control device 200 and the display device 100 transmits/receives signals through a predetermined frequency band.

In addition, the controller 280 of the remote control device 200 can store, in the storage unit 270, information on a frequency band for transmitting/receiving signals to/from the display device 100 paired with the remote control device 200 and refer to it. The controller 280 controls general matters relating to a control of the remote control device 200. The controller 280 can transmit a signal corresponding to a predetermined key manipulation of the user input unit 235 or a signal corresponding to a movement of the remote control device 200 sensed by the sensor unit 240 to the display device 100 through the wireless communication unit 225.

Additionally, the voice acquisition unit 290 of the remote control device 200 can obtain voice. The voice acquisition unit 290 can include at least one microphone 291 and obtain voice through the microphone 291.

Figure 4:
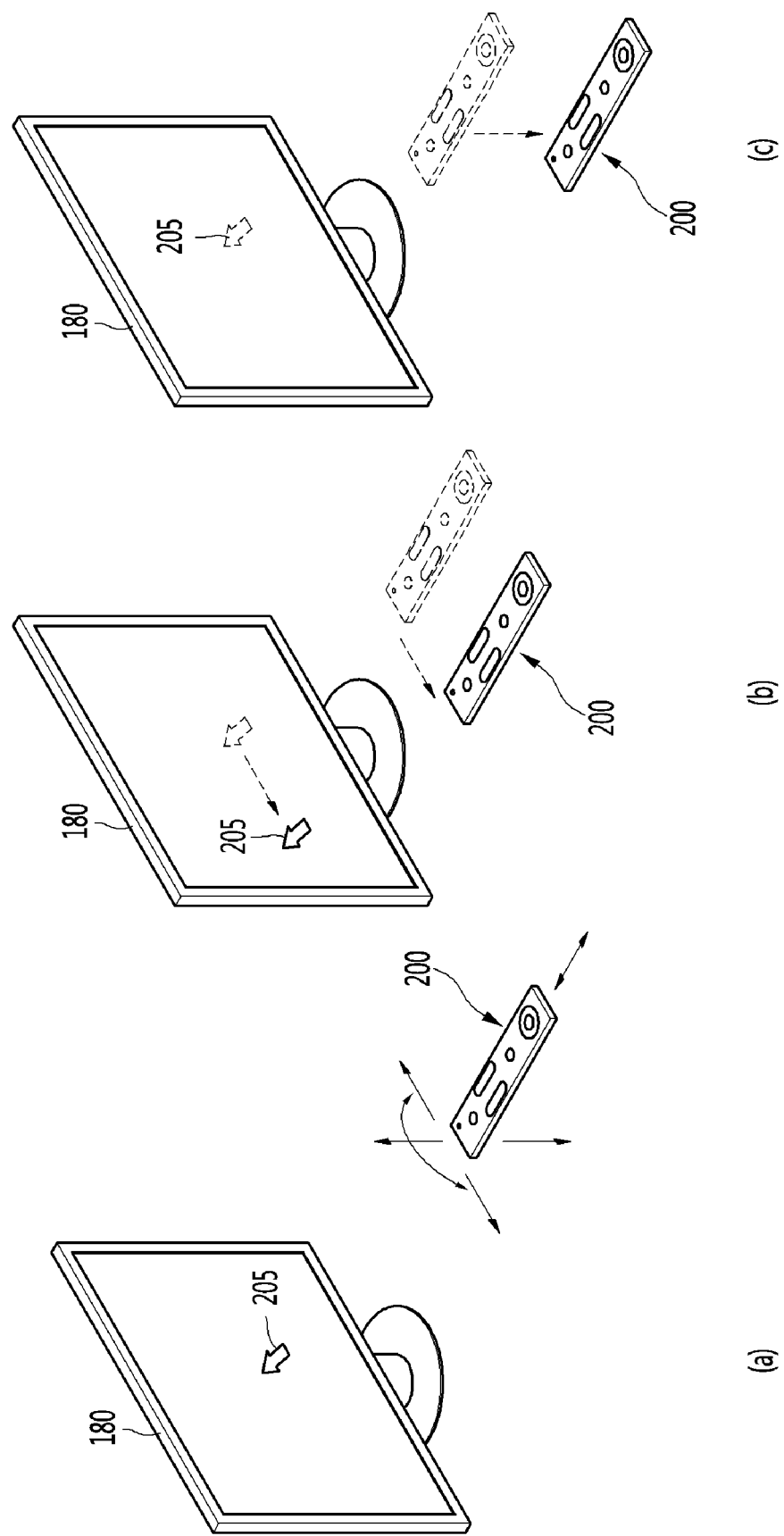
FIG. 4 is a view of utilizing a remote control device according to an embodiment of the present disclosure.

Next, FIG. 4 is a view of utilizing a remote control device according to an embodiment of the present disclosure. In particular, FIG. 4(a) illustrates that a pointer 205 corresponding to the remote control device 200 is displayed on the display 180.

In addition, a user can move or rotate the remote control device 200 vertically or horizontally. Thus, the pointer 205 displayed on the display 180 of the display device 100 corresponds to a movement of the remote control device 200. Since the corresponding pointer 205 is moved and displayed according to a movement on a 3D space as show in the drawing, the remote control device 200 can be referred to as a spatial remote controller.

FIG. 4(b) illustrates that if a user moves the remote control device 200, the pointer 205 displayed on the display 180 of the display device 100 is moved to the left in correspondence thereto. Information on a movement of the remote control device 200 detected through a sensor of the remote control device 200 is transmitted to the display device 100. The display device 100 can calculate the coordinates of the pointer 205 from the information on the movement of the remote control device 200. The display device 100 can display the pointer 205 to match the calculated coordinates.

In addition, FIG. 4(c) illustrates that while a specific button in the remote control device 200 is pressed, a user moves the remote control device 200 away from the display 180. Thus, a selection area in the display 180 corresponding to the pointer 205 can be zoomed in and displayed largely. If a user moves the remote control device 200 close to the display 180, a selection area in the display 180 corresponding to the pointer 205 can be zoomed out and displayed reduced.

If the remote control device 200 is away from the display 180, a selection area can be zoomed out and if the remote control device 200 is close to the display 180, a selection area can be zoomed in. Additionally, if a specific button in the remote control device 200 is pressed, the recognition of a vertical or horizontal movement can be excluded. That is, if the remote control device 200 is moved away from or close to the display 180, the up, down, left, or right movement cannot be recognized and only the back and forth movement can be recognized. While a specific button in the remote control device 200 is not pressed, only the pointer 205 is moved according to the up, down, left or right movement of the remote control device 200.

Further, the moving speed or moving direction of the pointer 205 can correspond to the moving speed or moving direction of the remote control device 200. In addition, a pointer in this specification means an object displayed on the display 180 in correspondence to an operation of the remote control device 200. Accordingly, besides an arrow form displayed as the pointer 205 in the drawing, various forms of objects are possible. For example, the above concept includes a point, a cursor, a prompt, and a thick outline. Then, the pointer 205 can be displayed in correspondence to one point of a horizontal axis and a vertical axis on the display 180 and also can be displayed in correspondence to a plurality of points such as a line and a surface.

Figure 5:
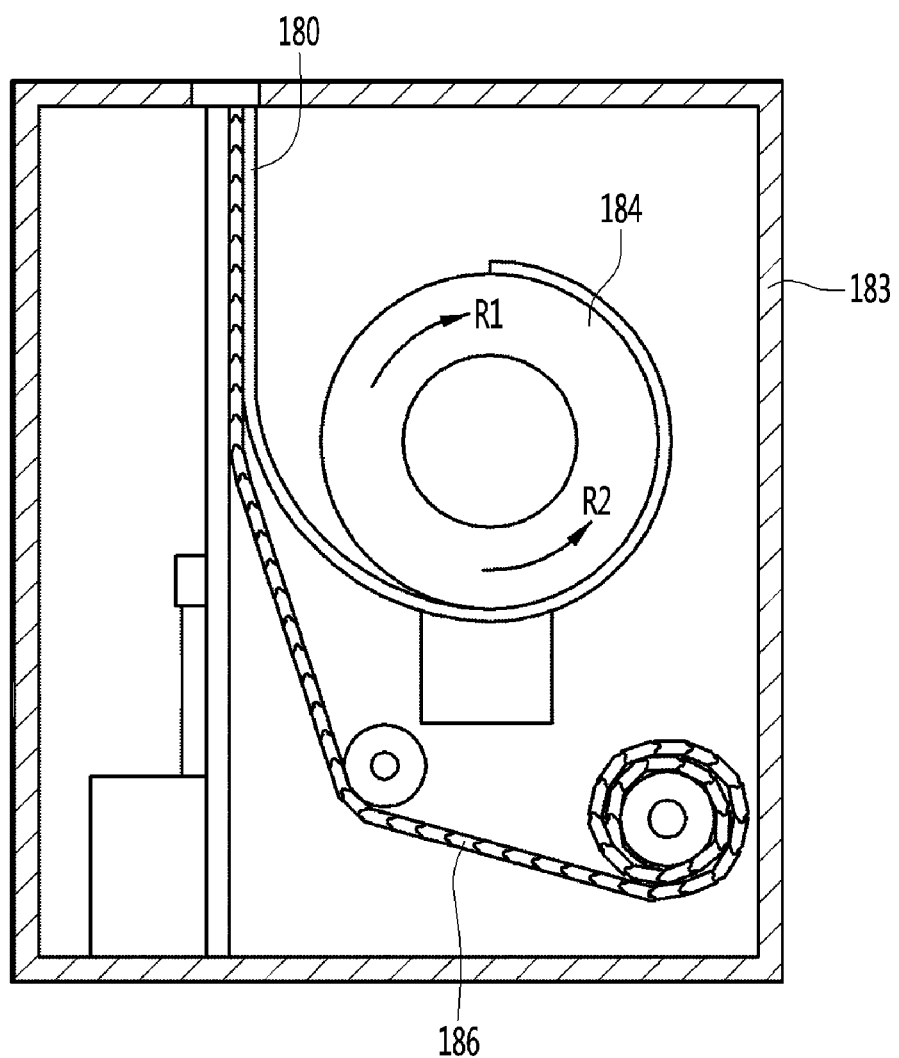
FIG. 5 is a cross-sectional view illustrating an internal part of a housing of a display device according to the present disclosure.

Next, FIG. 5 is a cross-sectional view illustrating an internal part of a housing of a display device 100 according to the present disclosure. As shown, the display device 100 can include a housing 183, a display 180 drawn into or out from the housing 183, and a roller 184 that guides the display 180 to be wound or unwound. As such, the display 180 drawn into or out from the housing 183 can be a rollable display, and the rollable display can be a display which can be significantly deformable with sufficient elasticity.

The roller 184 can be received in the housing 183 and is rotatable such that the display 180 is wound or unwound. In addition, the roller 184 can be a guide bar that guides the display 180 to be wound or unwound.

Referring to FIG. 5, when the roller 184 rotates in the R1 direction, the display 180 can be drawn out from the housing 183. In contrast, when the roller 184 rotates in the R2 direction, the display 180 can be drawn into the housing 183, while being wound around the roller 184. As such, the display 180 can be drawn out or drawn in an up-down direction.

In particular, as shown in FIG. 5, the display 180 can be drawn out or drawn in the up-down direction. According to an embodiment, the display device 100 can be configured such that the display 180 is drawn out or drawn in a left-right direction.

Further, the display 180 can be drawn out from the housing 183 or can be drawn into the housing 183 according to rotation of the roller 184. The controller 170 can control the display 180 to display content in an area of the display 180 drawn out from the housing 183.

As shown in FIG. 5, the display device 100 can further include a cover 186 disposed in the housing 183 and protecting the display 180 drawn in the housing 183. As such, as the display 180 is drawn out from or drawn into the housing 183, the area where content is displayed can increase or decrease. That is, the display area of the content of the display 180 varies as the display 180 is drawn out or drawn in.

Figure 6:
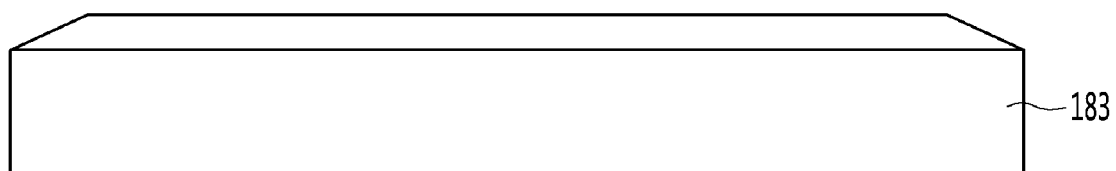
FIG. 6 is a view illustrating an appearance of the display device when a mode of the display is the zero view mode according to an embodiment of the present disclosure.
Figure 7:
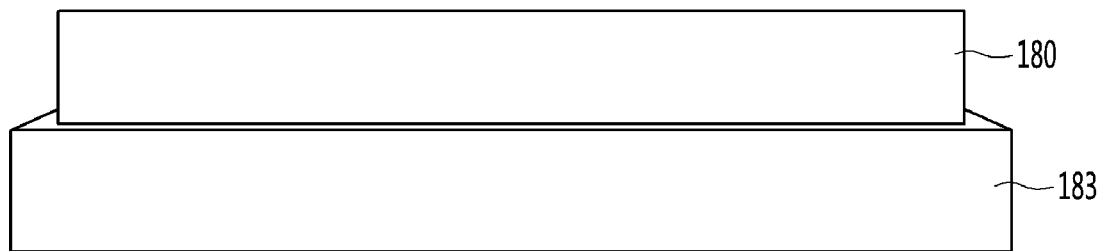
FIG. 7 is a view illustrating an appearance of the display device when a mode of the display is the partial view mode according to an embodiment of the present disclosure.
Figure 8:
FIG. 8 is a view illustrating an appearance of the display device when a mode of the display is the full view mode according to an embodiment of the present disclosure.

Next, a mode of the display 180 will be described with reference to FIGS. 6 to 8. In particular, FIG. 6 is a view illustrating an appearance of the display device when a mode of the display is the zero view mode, FIG. 7 is a view illustrating an appearance of the display device when a mode of the display is the partial view mode, and FIG. 8 is a view illustrating an appearance of the display device when a mode of the display is the full view mode according to embodiments of the present disclosure.

In addition, terms used in the present disclosure, for example, "zero view mode", "partial view mode" and "full view mode" are merely examples for convenience of description, and thus these terms can be modified. Therefore, the present disclosure is not limited thereto.

The display 180 can be controlled in the zero view mode, the partial view mode or the full view mode according to rotation of the roller 184. The zero view mode is a mode in which the display 180 operates in a state in which the display 180 is entirely drawn in the housing 183. As shown in FIG. 6, in the zero view mode, the display 180 is entirely located inside the housing 183.

For example, when operating in a speaker mode, the display device 100 can control the mode of the display to be in the zero view mode. In addition, when the display device 100 is powered off, the display 180 can be controlled to be in the zero view mode. When the display 180 is in the zero view mode, the display 180 does not display content in the entire area of the display 180. The display 180 can also be turned off in the zero view mode.

The partial view mode is a mode in which the display 180 operates in a state of being partially drawn out from the housing 183. The partial view mode can be a mode in which the display 180 operates in a state of being drawn out from the housing 183 shorter than that in the full view mode. As shown in FIG. 7, in the partial view mode, a part of the display 180 can be located inside the housing 183 and a remaining part of the display 180 can be located outside the housing 183.

For example, when the display device 100 operates in a menu mode, a mood mode, a music mode, a frame mode, or a clock mode, the mode of the display can be controlled in the partial view mode. When the display 180 is in the partial view mode, the display 180 can display content only in an area of the display 180 drawn out from the housing 183. That is, in the partial view mode, the content is not displayed in an area of the display 180 drawn in the housing 183.

Further, a length of the display 180 drawn out from the housing 183 in the partial view mode can vary. A drawn-out length of the display 180 shown in FIG. 7 is merely an example for convenience of description. That is, a case where the display 180 is drawn out to be less than the drawn-out length of the display 180 in the full view mode can be included in the partial view mode.

The full view mode is a mode in which the display 180 operates in a state of being maximally drawn out from the housing 183. That is, the full view mode is a mode in which a length of the display 180 drawn out from the housing 183 is a maximum. As shown in FIG. 8, in the full view mode, the display 180 can be entirely drawn out from the housing 183.

For example, when the display device 100 operates in a normal mode, the display can be controlled in the full view mode, and here, the normal mode can be a mode in which a broadcast image, an input image from the external device interface unit 135, and the like is output. When the display 180 is in the full view mode, content can be displayed in an area of the display 180 drawn from the housing 183. In the full view mode, the display 180 can display content in the entire area of the display 180 available for outputting an image.

As described above with reference to FIGS. 6 to 8, the display area of the content can vary depending on the display mode, that is, the drawn-out length of the display 180. In addition, FIGS. 6 to 8 illustrate the display device 100 has a shape such as a TV, and hereinafter, in FIGS. 9 to 11, the zero view mode, the partial view mode, and the full view mode will be described based on the display device 100 having a shape of a mobile terminal such as a smartphone or the like as an example.

Figure 9:
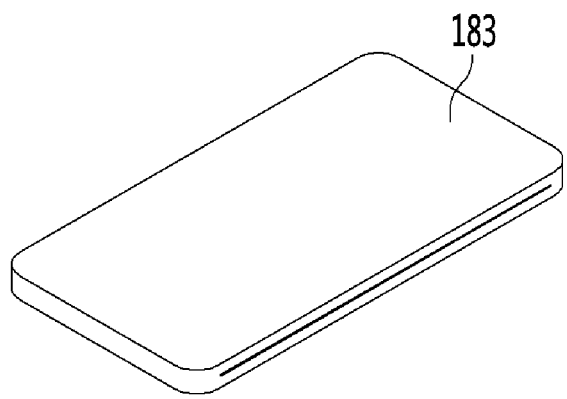
FIG. 9 is a view illustrating another example of an appearance of the display device when a mode of the display is the zero view mode according to an embodiment of the present disclosure.
Figure 10:
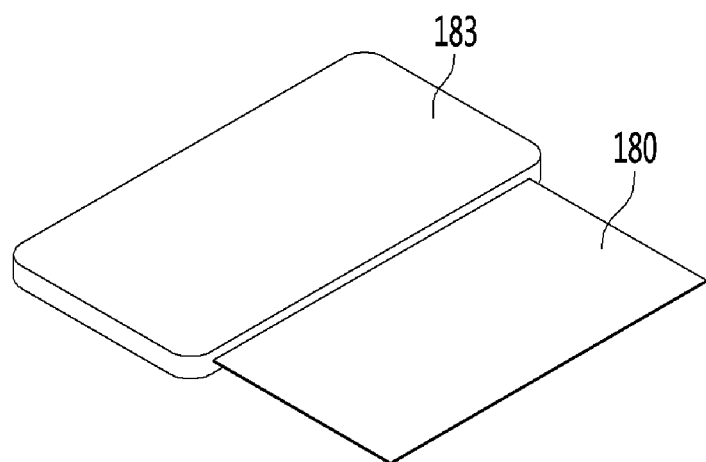
FIG. 10 is a view illustrating another example of an appearance of the display device when a mode of the display is the partial view mode according to an embodiment of the present disclosure.
Figure 11:
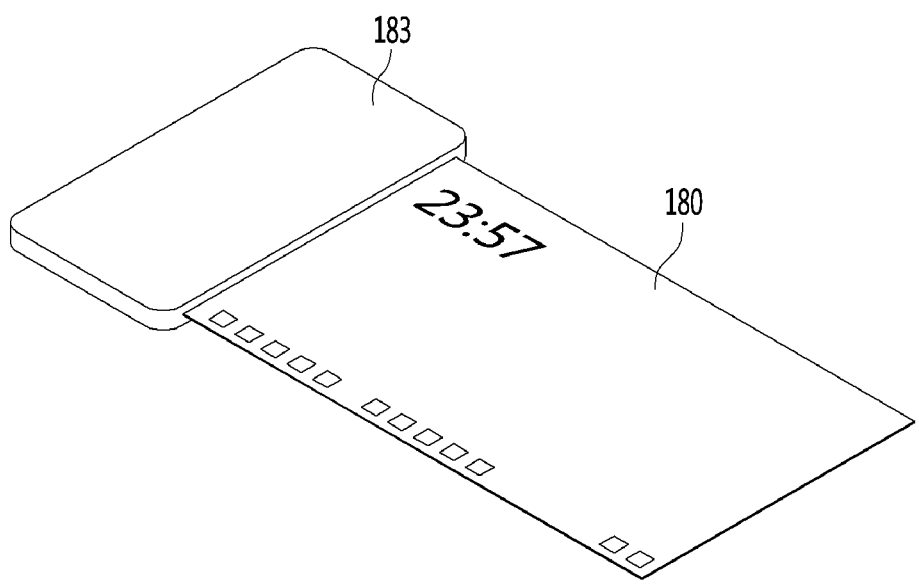
FIG. 11 is a view illustrating another example of an appearance of the display device when a mode of the display is the full view mode according to an embodiment of the present disclosure.

In particular, FIG. 9 is a view illustrating another example of an appearance of the display device when a mode of the display is the zero view mode, FIG. 10 is a view illustrating another example of an appearance of the display device when a mode of the display is the partial view mode, and FIG. 11 is a view illustrating another example of an appearance of the display device when a mode of the display is the full view mode according to embodiments of the present disclosure.

When the display device 100 is a mobile terminal such as a smartphone, the display 180 can be drawn out from or drawn into the housing 183. Accordingly, as described above with reference to FIGS. 6 to 8, the mobile terminal can be controlled in the zero view mode, the partial view mode, or the full view mode.

As discussed above, the zero view mode is a mode in which the display 180 operates in a state of being entirely drawn in the housing 183 as shown in FIG. 9. In addition, the partial view mode is a mode in which the display 180 operates in a state of being drawn out from the housing 183 as shown in FIG. 10. Also, a length of the display 180 drawn out from the housing 183 in the partial view mode can vary. The drawn-out length of the display 180 shown in FIG. 10 is merely an example for convenience of description. That is, when the display 180 is drawn out to be less than the drawn-out length of the display 180 in the full view mode can be included in the partial view mode.

The full view mode is a mode in which the display 180 operates in a state of being drawn out from the housing 183 at the maximum as shown in FIG. 11. As described above, since the length of the display 180 drawn out from the housing 183 varies according to the mode of the display 180 and the mode of the display 180 is determined according to the length of the display 180 drawn out from the housing 183, and thus, hereinafter, the mode of the display 180" can be replaced with the "drawn-out length of the display 180", and conversely, the "drawn-out length of the display 180" can be replaced with the "mode of the display 180."

All the embodiments described below will be applied to the display device 100 that operates as shown in FIGS. 9 to 11, as well as to the display device 100 that operates as shown in FIGS. 6 to 8.

When the display device 100 receives a voice command, the display device 100 can provide a result of the voice command to a user. For example, when the display device 100 receives a voice command when the display 180 is in the full view mode, the display device 100 can provide a result of the voice command to the user by displaying the result of the voice command on the display 180. When the display 180 receives a voice command while the display 180 is in the zero view mode, the display device 100 can draw out the display 180 to display a result of the voice command. In this instance, however, since it takes time for the display 180 to be drawn out from the housing 183, it can be difficult to immediately provide the result of the voice command to the user.

Therefore, upon receiving the voice command, the display device 100 according to the present disclosure can control a method of providing the result of the voice command differently according to the mode of the display 180.

Figure 12:
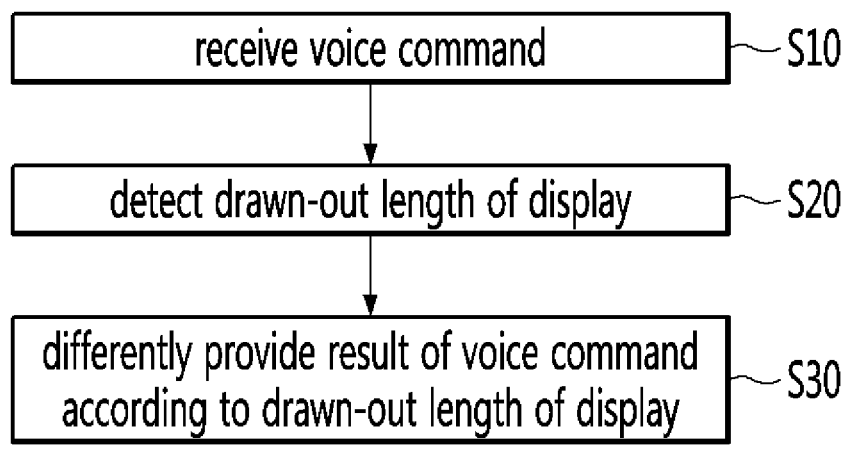
FIG. 12 is a flowchart illustrating a method of operating a display device according to the present disclosure.

In particular, FIG. 12 is a flowchart illustrating a method of operating a display device according to the present disclosure. The controller 170 receives a voice command (S10), for example, through the voice acquisition unit 175 provided in the housing 183 or through a voice acquisition unit 291 provided in the remote control device 200.

Upon receiving the voice command, the controller detects a drawn-out length of the display 180 (S20). That is, the controller 170 receives the voice command, the controller 170 can detect the drawn-out length of the display 180 drawn out from the housing 183. For example, the controller 170 can detect the drawn-out length of the display 180 by determining whether a mode of the display 180 is the zero view mode, the partial view mode, or the full view mode when the voice command is received.

In addition, the controller 170 can provide a result of the voice command differently according to the drawn-out length of the display 180 (S30). That is, the controller 170 can control the method of providing a result of the voice command differently according to the drawn-out length of the display 180. In addition, the controller 170 can control the result of the voice command differently according to the mode of the display 180.

Next, various methods of providing the results of the voice command differently according to the drawn-out length of the display 180 or the mode of the display 180 will be described. According to a first embodiment, the controller 170 can output a result of a voice command as audio when the display 180 is not drawn out from the housing 183, and the controller 170 can display the result of the voice command on the display 180 when at least a part of the display 180 is drawn out from the housing 183. When at least a part of the display 180 is drawn out from the housing 183, the controller 170 can adjust the amount of the result of the voice command output on the display 180 according to the drawn-out length of the display 180. For example, the controller 170 can increase the amount of the result of the voice command output on the display 180 as the drawn-out length of the display 180 is longer, and the controller 170 can decrease the amount of the result of the voice command output on the display 180 as the drawn-out length of the display 180 is shorter. As another example, the controller 170 can output the entire result of the voice command on the display 180 if the drawn-out length is greater than or equal to a preset length, and the controller 170 can output summary information of the result of the voice command if the drawn-out length is less than the preset length.

Alternatively, the controller 170 can output a search result corresponding to the voice command, as audio, when the display 180 is in the zero view mode, and the controller 170 can output the search result corresponding to the voice command on the display 180 when the display 180 is in the partial view mode or the full view mode.

In this instance, information output on the display 180 in the partial view mode and information output on the display 180 in the full view mode can be the same or different. For example, the controller 170 can output the same information on the display 180 regardless of the partial view mode or the full view mode.

As another example, the controller 170 can display the entire search result corresponding to the voice command on the display 180 in the full view mode, and the controller 170 can display summary information of the search result corresponding to the voice command in the partial view mode. For example, the controller 170 can output the search result corresponding to the voice command, as audio, when the display 180 is in the zero view mode, the controller 170 can output the search result corresponding to the voice command on the display 180 when the display 180 is in the full view mode, and the controller 170 can output the summary information of the search result corresponding to the voice command on the display 180 when the display 180 is in the partial view mode.

Figure 13:
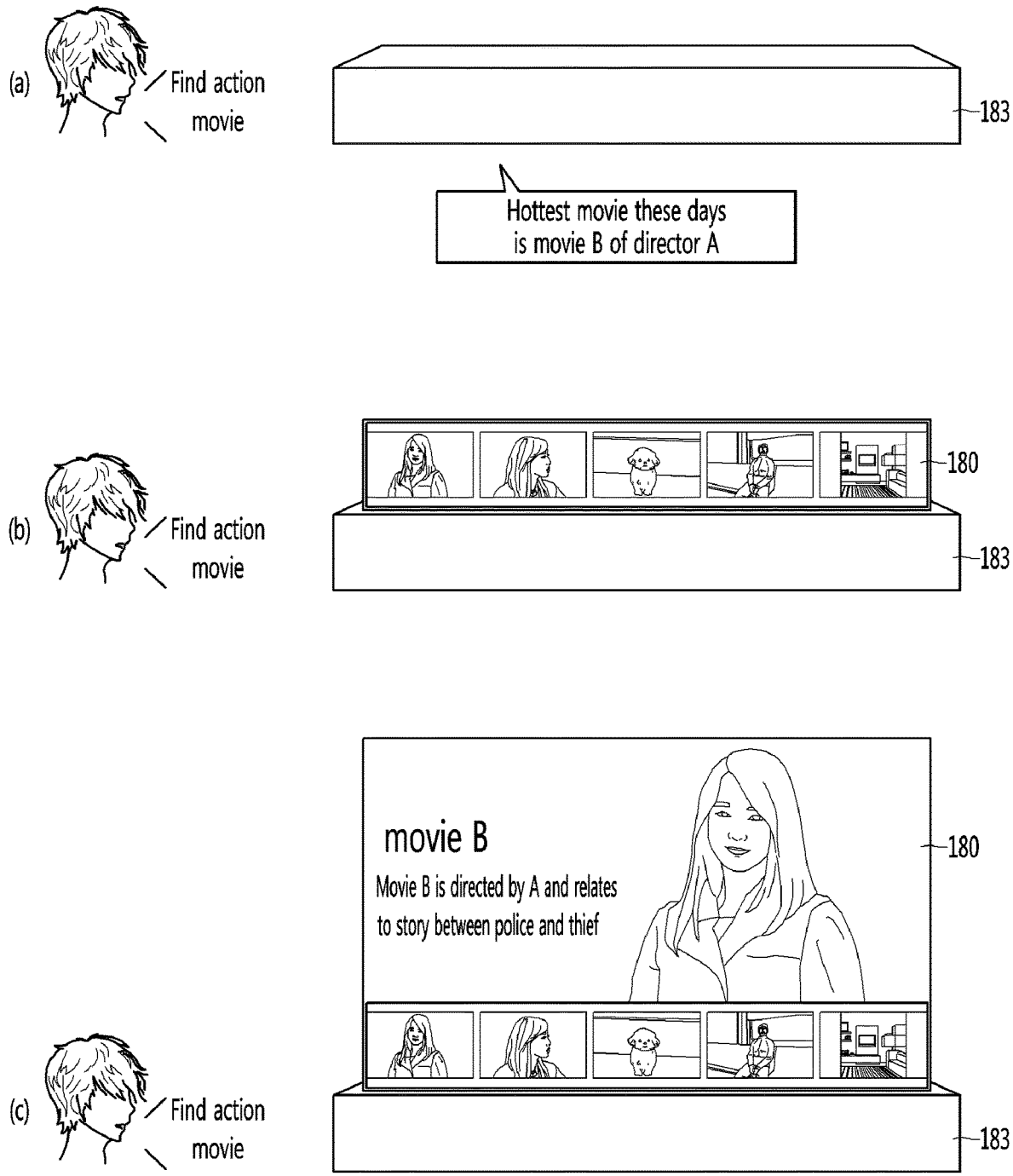
FIGS. 13 to 15 are views illustrating a first embodiment of a method in which a display device according to the present disclosure provides a result of a voice command differently according to a mode of a display.
Figure 14:
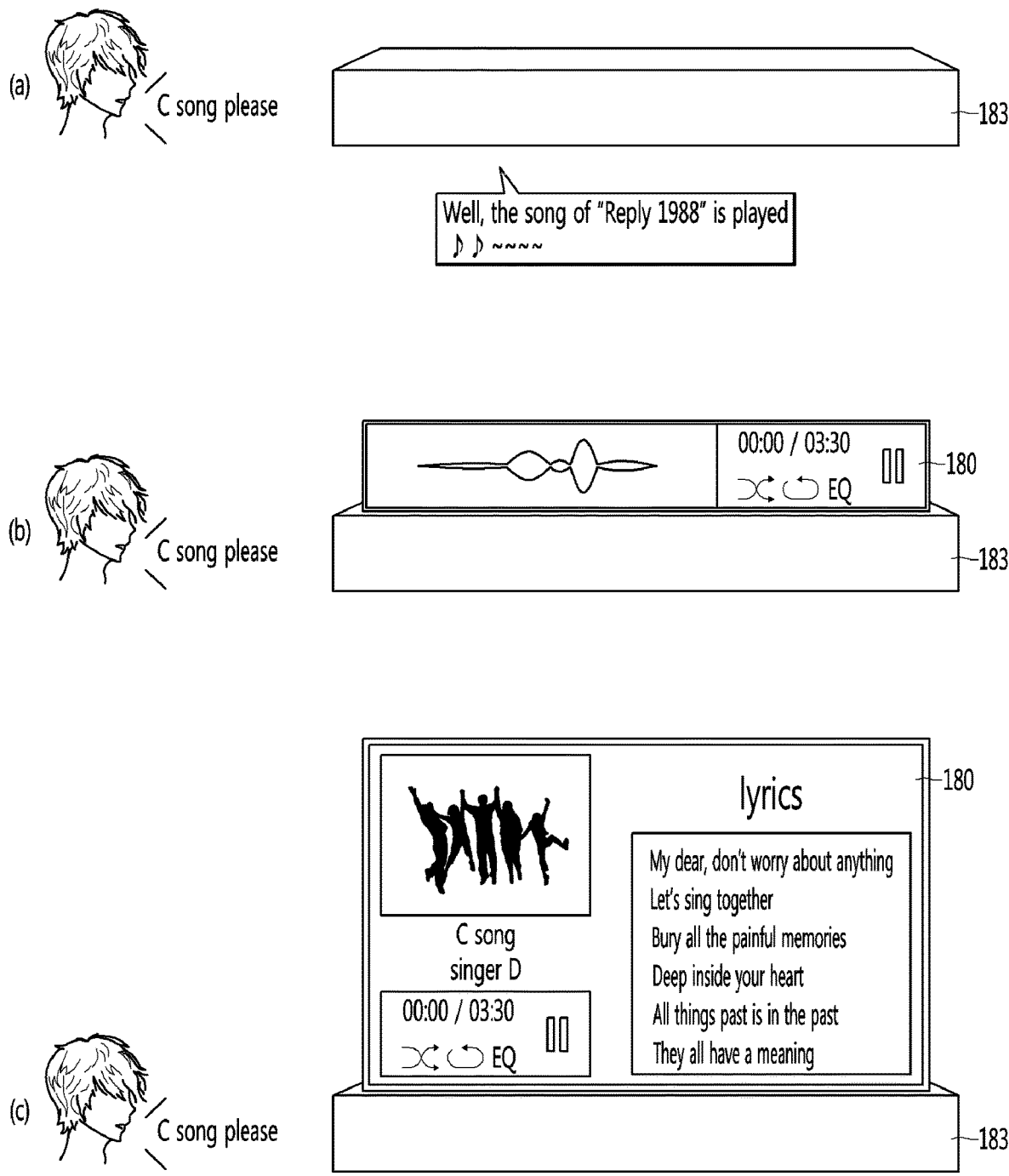
Figure 15:
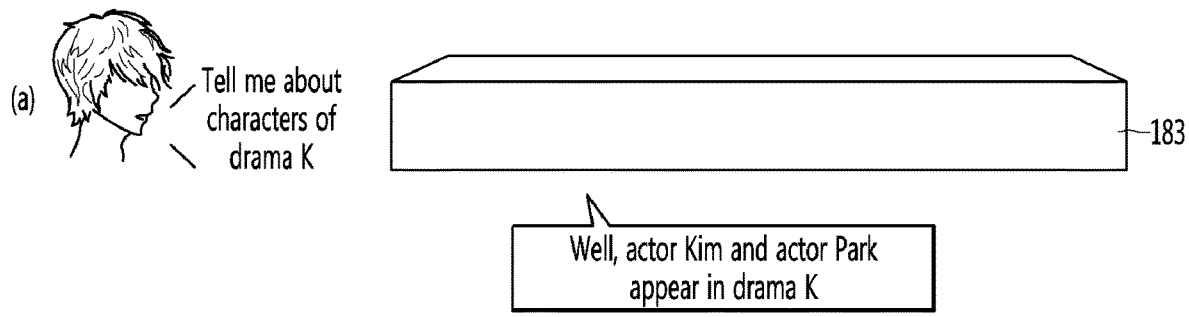
Figure 15:
Figure 15:
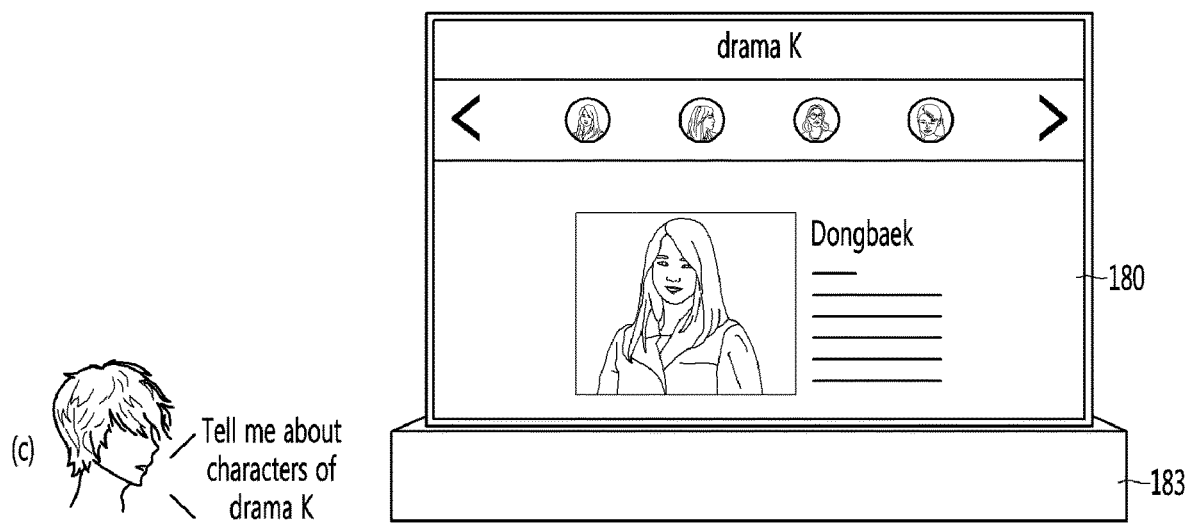

Next, FIGS. 13 to 15 are views illustrating a first embodiment of a method in which a display device according to the present disclosure provides a result of a voice command differently according to a mode of a display. Referring to the example shown in FIG. 13, the controller 170 can receive a voice command such as "Find action movie." That is, the controller 170 can receive a voice command such as "Find action movie" when the display 180 is in the zero view mode, the partial view mode, or the full view mode.

As shown in (a) of FIG. 13, when the voice command of "Find action movie" is received when the display 180 is in the zero view mode, the controller 170 can output a search result corresponding to the voice command through the audio output unit 185. The audio output unit 185 can be provided on a front surface of the housing 183, but this is merely an example and the audio output unit 185 is not limited thereto. Hereinafter, it is assumed that the audio output unit 185 is provided on the front surface of the housing 183.

As shown in (b) of FIG. 13, when the voice command of "Find action movie" is received when the display 180 is in the partial view mode, the controller 170 can display summary information of the search result corresponding to the voice command on the display 180. The summary information of the search result corresponding to the voice command can refer to a part of the search result based on the voice command. For example, the summary information of the search result corresponding to the voice command can be a content menu including content items representing the retrieved content (e.g., an action movie), respectively, but this is merely an example.

As shown in (c) of FIG. 13, when the voice command of "Find action movie" is received when the display 180 is in the full view mode, the controller 170 can display a search result corresponding to the voice command on the display 180. The search result corresponding to the voice command can refer to the entire search result according to the voice command. For example, the search result corresponding to the voice command can be a content menu including content items representing the retrieved content (e.g., an action movie), respectively, and at least one content preview, but this is merely an example.

Referring to the example shown in FIG. 14, the controller 170 can receive a voice command such as "C song please." That is, the controller 170 can receive the voice command such as "C song please" when the display 180 is in the zero view mode, the partial view mode, or the full view mode.

As shown in (a) of FIG. 14, when the controller 170 receives the voice command of "C song please" in the zero view mode, the controller 170 can output a search result corresponding to the voice command through the audio output unit 185. For example, the controller 170 can control the audio output unit 185 to output the searched song according to the voice command.

As shown in (b) of FIG. 14, when the voice command of "C song please" is received in the partial view mode, the controller 170 can control the audio output unit 185 to play the searched song and display summary information of the search result corresponding to the voice command on the display 180. In this instance, the summary information of the search result corresponding to the voice command can be playback information of the song being played, but this is merely an example and the present disclosure is not limited thereto. The playback information can include a playback time, a playback icon, and the like.

As shown in (c) of FIG. 14, when the voice command of "C song please" is received in the full view mode, the controller 170 can control the audio output unit 185 to play the searched song and display a search result corresponding to the voice command on the display 180. In this instance, the search result corresponding to the voice command can include at least one of playback information, lyrics information, and album information of the song being played, but this is merely an example and the present disclosure is not limited thereto.

Referring to the example shown in FIG. 15, the controller 170 can receive a voice command such as "Tell me about characters of drama K." That is, the controller 170 can receive the voice command such as "Tell me about characters of drama K" when the display 180 is in the zero view mode, the partial view mode, or the full view mode.

As shown in (a) of FIG. 15, when the voice command of "Tell me about characters of drama K" is received when the display 180 is in the zero view mode, the controller 170 can output a search corresponding to the voice command through the audio output unit 185. For example, the audio output unit 185 can retrieve characters of "drama K" according to the voice command and output the retrieved characters to the audio output unit 185.

As shown in (b) of FIG. 15, when the voice command of "Tell me about characters of drama K" when the display 180 is in the partial view mode, the controller 170 can display summary information of the search result corresponding to the voice command on the display 180. For example, the summary information of the search result corresponding to the voice command can be character information retrieved from an internal server and can include at least one of a name and an image representing each of retrieved characters, but this is merely an example.

As shown in (c) of FIG. 15, when the voice command of "Tell me about characters of drama K" is received when the display 180 is in the full view mode, the controller 170 can display the search result corresponding to the voice command on the display 180. For example, the search result corresponding to the voice command can be character information provided from a homepage of "Drama K." That is, the search result corresponding to the voice command can be deep-linked to a character information page provided in the homepage of "Drama K", but this is merely an example.

As described above with reference to various examples, according to the first embodiment, the display device 100 can immediately display the result of the voice command according to the mode of the current display 180 even if the same voice command is received. Therefore, a time required to display the result of the voice command is minimized.

According to a second embodiment, if the display 180 is in the zero view mode or the partial view mode, the controller 170 can allow the user to select whether to receive additional information after providing a result of the voice command. Specifically, the controller 170 can allow the user to select whether to output the result of the voice command to the screen after outputting the result of the voice command as audio when the display 180 is not drawn out from the housing 183. In addition, controller 170 can control the roller 184 such that the display 180 is drawn out from the housing 183 when a command for outputting a result of the voice command to the screen is received.

Similarly, when only a part of the display 180 is drawn out from the housing, the controller 170 can output the result of the voice command on the part of the display 180 and allow the user to select whether to further output additional information in addition to the output information. When a command for further outputting additional information in addition to the output information is received, the controller 170 can control the roller 184 to draw out the display 180 from the housing 183.

Alternatively, if the display 180 is in the zero view mode, the controller 170 can provide the result of the voice command as audio and subsequently allow the user to select whether to output the result of the voice command to the screen. When the display 180 is in the partial view mode, the controller 170 can display the result of the voice command on the display 180 and subsequently allow the user to select whether to further display additional information in addition to the displayed information on the display 180.

Figure 16:
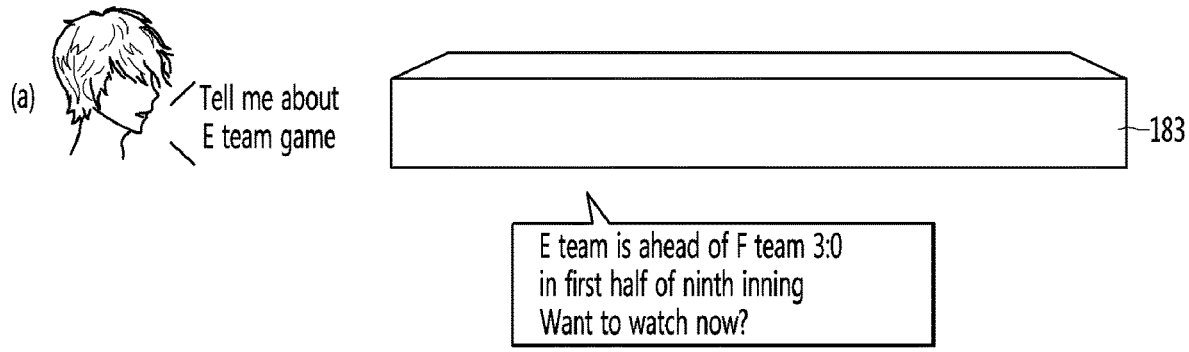
FIG. 16 is a view illustrating a second embodiment of a method in which the display device according to the present disclosure provides a result of a voice command differently according to a mode of the display.
Figure 16:
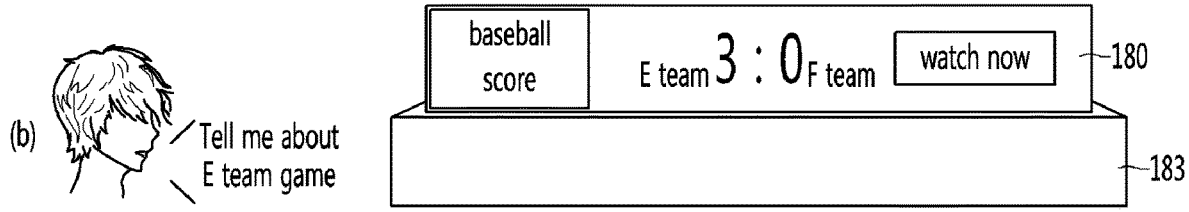
Figure 16:
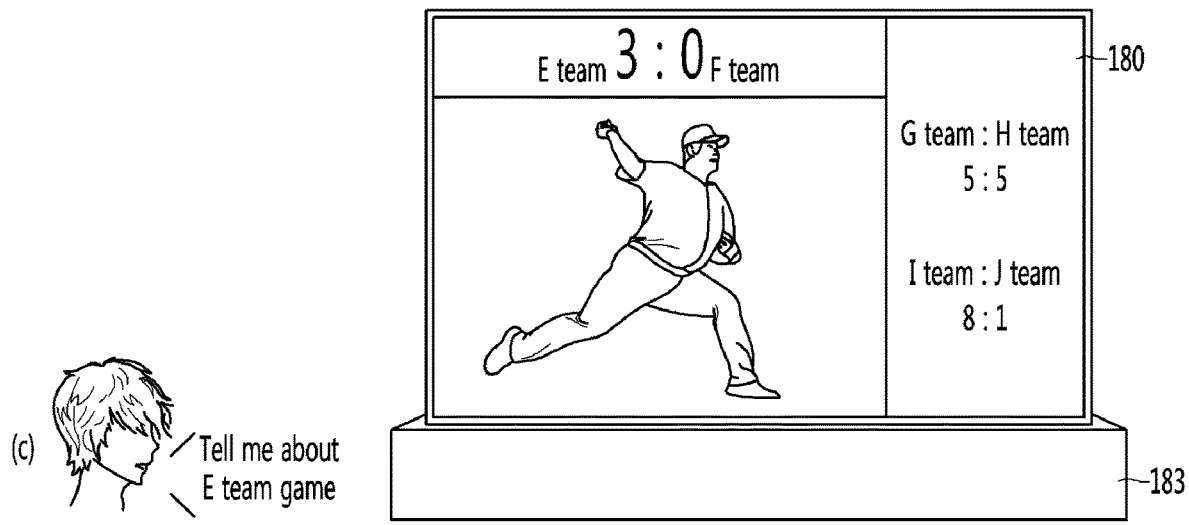

Next, FIG. 16 is a view illustrating a second embodiment of a method in which the display device according to the present disclosure provides a result of a voice command differently according to a mode of the display. Referring to the example shown in FIG. 16, the controller 170 can receive a voice command such as "Tell me about E team match." That is, the controller 170 can receive the voice command such as "Tell me about E team match" when the display 180 is in the zero view mode, the partial view mode, or the full view mode.

As shown in (a) of FIG. 16, when the voice command of "Tell me about E team match" is received when the display 180 is in the zero view mode, the controller 170 can output a search result corresponding to the voice command through the audio output unit 185, and the controller 17 can further output a message inquiring whether to further receive additional information through the audio output unit 185.

Here, the message inquiring whether to further receive additional information can be a message for selecting whether to output the result of the voice command to the screen. For example, the controller 170 can output "E team is ahead of F team 3:0 in first half of ninth inning" as a message of the search result of E team match and a message inquiring whether to further receive additional information "Want to watch now?" to the audio output unit 185.

In this instance, the controller 170 can further receive a voice command for selecting whether to receive additional information. When the command for selecting to further receive additional information is received, the controller 170 can draw out the display 180 from the housing to output a screen as shown in (b) of FIG. 16 or (c) of FIG. 16. That is, when the command for outputting the result of the voice command to the screen is received after providing the result of the voice command as audio in the zero view mode, the controller 170 can control the display 180 to the full view of the partial view from the zero view mode and further display the result information of the voice command on the display 180.

As shown in (b) of FIG. 16, if the voice command of "Tell me about E team match" when the display 180 is in the partial view mode, the controller 170 can display a message inquiring whether to further receive additional information together with the search result corresponding to the voice command. Here, the message inquiring whether to receive additional information can be a "watch now" icon, but this is merely an example. In this instance, when a selection command of the "watch now" icon is received, the controller 170 can further draw out the display 180 from the housing and output the screen as shown in (c) FIG. 16.

As shown in (c) of FIG. 16, if the voice command "Tell me about E team match" is received when the display 180 is in the full view mode, the controller 180 can display a search result corresponding to the voice command on the display 180. According to the second embodiment, the display device 100 can immediately provide the additional information according to a user's needs, while displaying the result of the voice command immediately when receiving the voice command, thereby providing information required by the user more rapidly.

According to a third embodiment, the controller 170 can provide the result of the voice command by adjusting the drawn-out length of the display 180 according to a mode of the current display 180 and a mode for outputting the result of the voice command. For example, although the voice command is received in the zero view mode, if the result of the voice command can be provided in the partial view mode or the full view mode, the controller 170 can provide the result of the voice command after increasing the drawn-out length of the display 180. Alternatively, although the voice command is received in the partial view mode, if the result of the voice command can be provided in the full view mode, the controller 170 can provide the result of the voice command after increasing the drawn-out length of the display 180.

Figure 17:
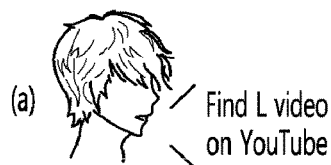
FIG. 17 is a view illustrating a third embodiment of a method in which the display device according to the present disclosure provides a result of a voice command differently according to a mode of the display.
Figure 17:
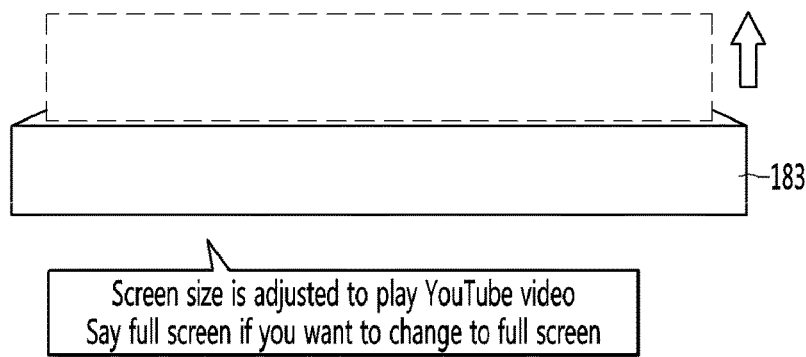
Figure 17:
Figure 17:
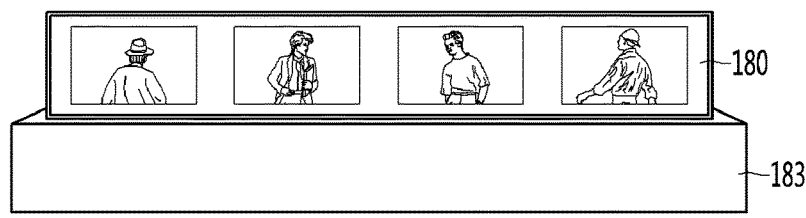
Figure 17:
Figure 17:
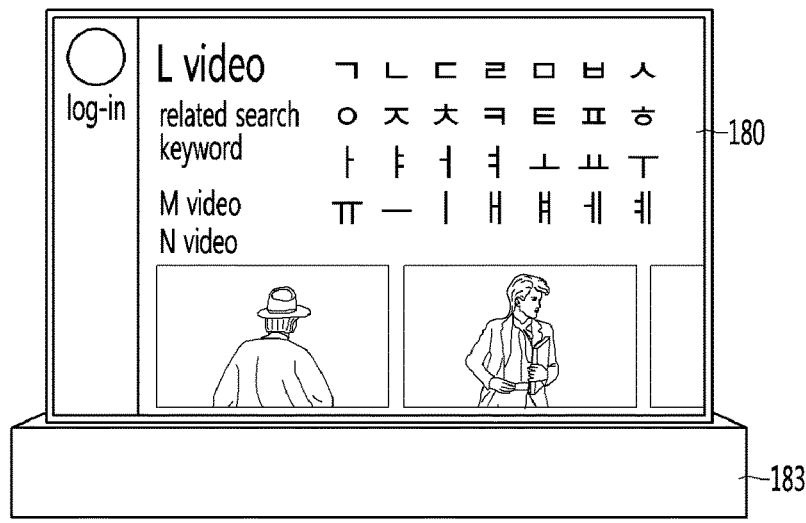

FIG. 17 is a view illustrating a third embodiment of a method in which the display device according to the present disclosure provides a result of a voice command differently according to a mode of the display. Referring to the example shown in FIG. 17, the controller 170 can receive a voice command such as "Find L video on YouTube." That is, the controller 170 can receive the voice command such as "Find L video on YouTube" when the display 180 is in the zero view mode, the partial view mode, or the full view mode.

As shown in (a) of FIG. 17, if the voice command of "Find L video on YouTube" when the display 180 is in the zero view mode, the controller 170 can obtain a search result corresponding to the voice command, and here, the result of the voice command can be provided in the partial view mode or the full view mode. For example, when the result of the voice command can be displayed on the display 180, the result of the voice command can be provided in the partial view mode or the full view mode.

If a mode of the current display 180 is the zero view mode and a mode for outputting the result of the voice command is the partial view mode or the full view mode, the controller 170 can draw out the display 180 from the housing 183 and subsequently display the result of the voice command.

In addition, the controller 170 can control the audio output unit 185 to output a message informing that the drawn-out length of the display 180 is adjusted. In addition, the controller 170 can further receive a voice command for selecting a screen size. For example, when the controller 170 receives a voice command such as "full screen", the controller 170 can control the display 180 to the full view mode and then display the result of the voice command.

Meanwhile, as shown in (b) of FIG. 17, if the voice command of "Find L video on YouTube" is received when the display 180 is in the partial view mode, the controller 170 can display summary information of the search result for the voice command. For example, the summary information of the search result for the voice command can be a part of an execution screen of an application corresponding to the voice command.

As shown in (c) of FIG. 17, if the voice command of "Find L video on YouTube" is received when the display 180 is in the full view mode, the controller 170 can display the search result of the voice command. For example, the search result of the voice command can be the entire execution screen of the application corresponding to the voice command. According to the third embodiment, the display device 100 automatically drives the display 180 to be suitable for providing the result of the voice command to the user, thereby providing user convenience.

According to a fourth embodiment, the controller 170 can additionally provide the result of the voice command by adjusting the drawn-out length of the display, while first outputting the result of the voice command that can be displayed according to the drawn-out length of the current display 180. Alternatively, the controller 170 can additionally provide the result of the voice command by adjusting the drawn-out length of the display 180, while outputting the result of the voice command according to the mode of the current display 180.

As an example, when the display 180 is not drawn out from the housing 183, the controller 170 can control the roller 184 to draw out the display 180 from the housing 183, while outputting the result of the voice command as audio. Alternatively, when the display 180 is in the zero view mode, the controller 170 can control the display 180 from the zero view mode to the full view mode or the partial view mode, while outputting the search result corresponding to the voice command as audio. That is, when the display 180 is in the zero view mode, the controller 170 can additionally provide the result of the voice command on the display 180 drawn out as the display 180 is controlled to the full view mode or the partial view mode.

As another example, if the drawn-out length is less than the preset length, the controller 170 can control the roller 184 to further draw out the display 180 from the housing 183, while outputting the summary information of the result of the voice command. The controller 170 can further display other information than the summary information on the display 180, while the display 180 is being further drawn out. Alternatively, when the display 180 is in the partial view mode, the controller 170 can control the display 180 from the partial view mode to the full view mode, while outputting the summary information of the search result corresponding to the voice command on the display 180. That is, if the display 180 is in the partial view mode, the controller 170 can display the summary information of the search result corresponding to the voice command on the display 180 and can additionally display other information than the summary information on the display 180, while the display 180 is being changed from the partial view mode to the full view mode.

Figure 18:
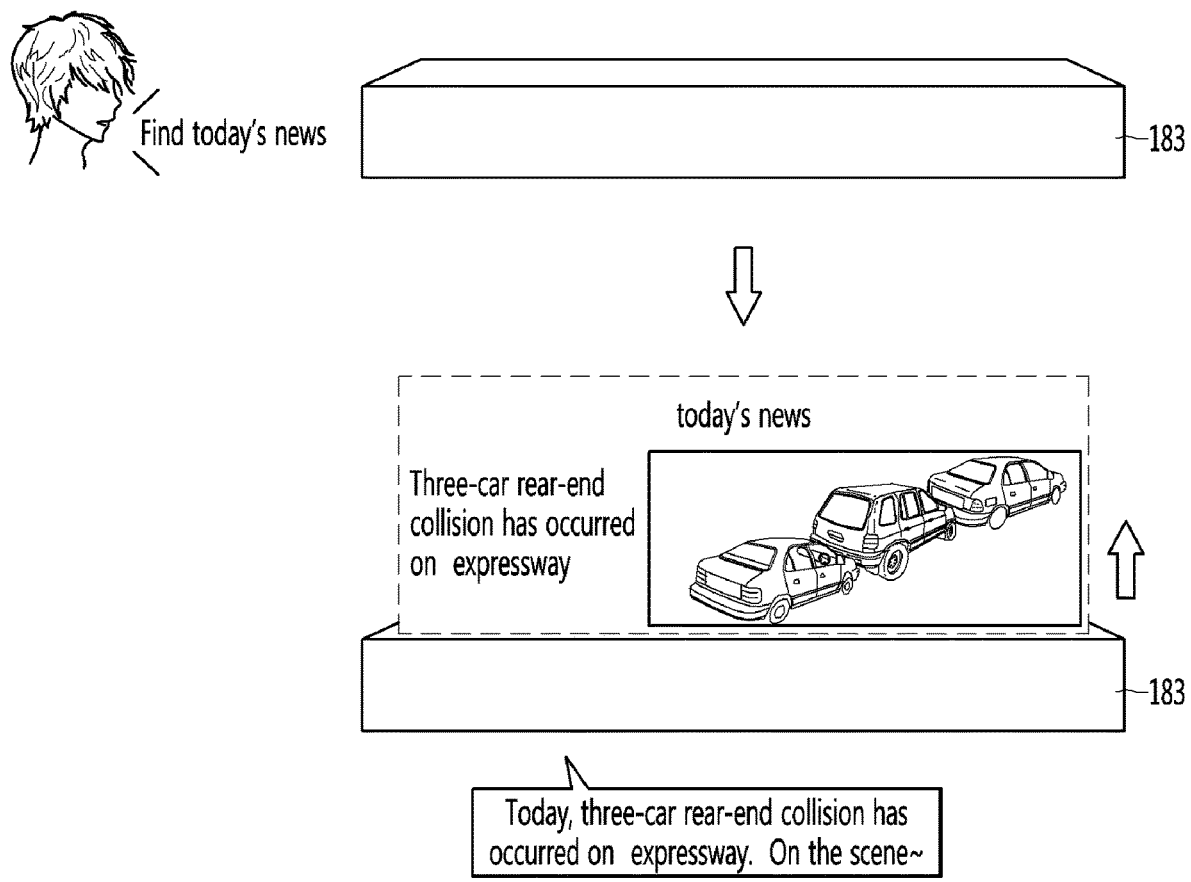
FIGS. 18 and 19 are views illustrating the fourth embodiment of a method in which the display device according to the present disclosure provides a result of a voice command differently according to a mode of a display.
Figure 19:
Figure 19:
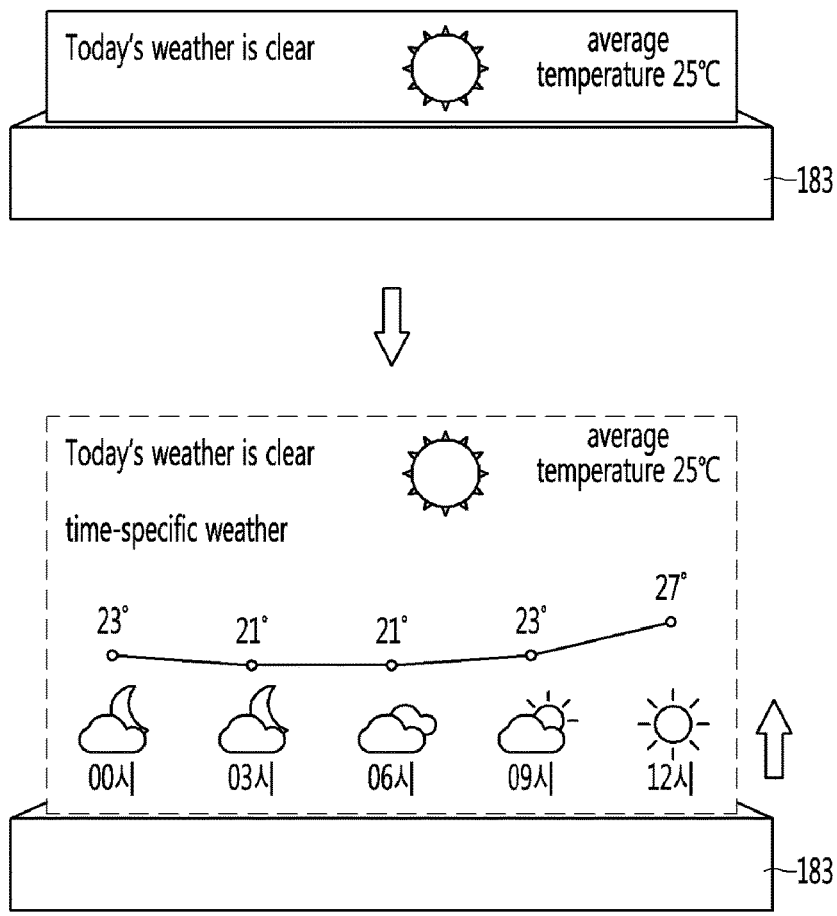

Next, FIGS. 18 and 19 are views illustrating the fourth embodiment of a method in which the display device according to the present disclosure provides a result of a voice command differently according to a mode of a display. The controller 170 can receive a voice command such as "Find today's news." For example, as shown in FIG. 18, when the voice command such as "Find today's news" is received in the zero view mode, the controller 170 can control the display 180 to the partial view mode or the full view mode, while outputting a result of the voice command through the audio output unit 185. That is, when the voice command is received in the zero view mode, the controller 170 can output the result of the voice command as audio and simultaneously output the result on the display 180.

In addition, the controller 170 can receive a voice command, such as "Tell me about weather." For example, as shown in FIG. 19, when the voice command such as "Tell me about the weather" is received in the partial view mode, the controller 170 can control the display 180 to the full view mode, while displaying summary information of a search result corresponding to the voice command. That is, when the voice command is received in the partial view mode, the controller 170 can display the result of the voice command on the display 180 and simultaneously additionally display the result of the voice command on the display 180 to be added. According to the example of FIG. 19, when the voice command of "Tell me about weather" is received, the controller 170 can first display today's weather and subsequently display the weather of the week on the display 180 which is added.

As described above, according to the fourth embodiment, the voice command is received, the display device 100 not only immediately displays the result according to the voice command but also further displays the result according to the voice command, thereby improving the possibility of providing the results desired by the user. Also, the display device 100 can not only control the method of providing the result of the voice command according to the drawn-out length or the mode of the current display 180 but also differently control the method of providing the result of the voice command in consideration of the voice command or the result of the voice command together with the drawn-out length or the mode of the current display. That is, the controller 170 can adjust the drawn-out length of the display 180 according to the result of the voice command. Alternatively, the controller 170 can control the display 180 to the zero view mode, the full view mode, or the partial view mode according to the result of the voice command.

Figure 20:
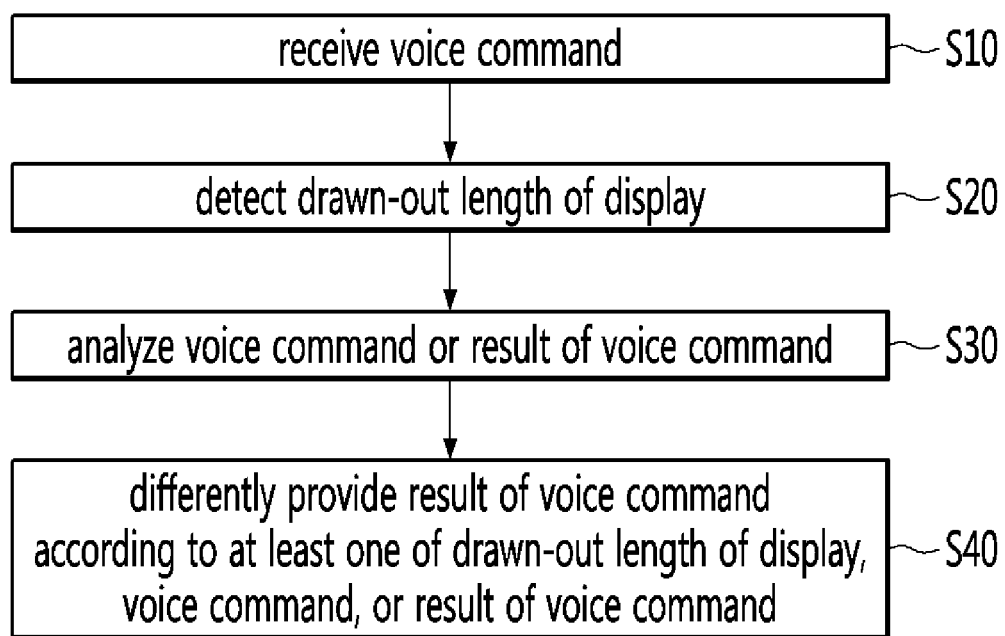
FIG. 20 shows a modification of the flowchart shown in FIG. 12.

Next, FIG. 20 shows a modification of the flowchart shown in FIG. 12. That is, FIG. 20 is a flowchart illustrating a method in which the display device according to the present disclosure controls a method of providing a result of a voice command based on a mode of the display and a result of the voice command.

As shown, the controller 170 can receive a voice command (S10), and can detect a drawn-out length of the display 180 when the voice command is received (S20). Steps S10 and S20 are the same as those described above with reference to FIG. 12, and thus, a redundant description thereof will be omitted. In addition, the controller 170 can analyze the voice command or a result of the voice command (S30). That is, the controller 170 can obtain a result of the voice command according to the reception of the voice command, and analyze the voice command or a result of the voice command.

For example, the controller 170 can analyze a size of the voice command. In addition, the controller 170 can analyze the result of the voice command as to whether the result of the voice command includes text only, whether an image is included in the result of the voice command, whether the voice command is a search command for an external device, or whether the voice command is a connection command for an external device, which type a question of the voice command is, and the like.

The controller 170 can provide the result of the voice command differently according to at least one of a drawn-out length of the display 180 (or a mode of the display 180), the voice command, or the result of the voice command (S40). That is, the controller 170 can differently control the method of providing the result of the voice command based on at least one of the mode of the display 180, the voice command, or the result of the voice command.

Hereinafter, various methods of differently providing a result of a voice command according to the drawn-out length or mode of the display 180 will be described with reference to FIGS. 12 to 19. In particular, the methods described below include methods of providing a result of the voice command based on at least one of a drawn-out length (or mode) of the display 180, a voice command, and a result of the voice command.

According to a fifth embodiment, if an image is included in a result of a voice command, the controller 170 can control the roller 184 to draw out at least a part of the display 180 from the housing 183, and if an image is not included in the result of the voice command, the controller 170 can control the roller 184 to draw the display 180 entirely into the housing 183. Alternatively, the controller 170 can control the display 180 to the full view mode or the partial view mode when an image is included in the result of the voice command, and the controller 170 can control the display 180 to the zero view mode when an image is not included in the result of the voice command.

For example, when the voice command is received in the zero view mode, if an image is included in the result of the voice command, the controller 170 can switch the display 180 from the zero view mode to the full view mode or the partial view mode and then provide the result of the voice command. When the voice command is received in the zero view mode, if an image is not included in the result of the voice command, the controller 170 can provide the result of the voice command, while maintaining the zero view mode.

When the voice command is received in the partial view mode or full view mode, if an image is included in the result of the voice command, the controller 170 can provide the result of the voice command in a state of maintaining the partial view mode or full view mode. When the voice command is received in the partial view mode or the full view mode, if an image is not included in the result of the voice command, the controller 170 can maintain the partial view mode or the full view mode or control the display 180 to the zero view mode and then provide the result of the voice command.

Figure 21:
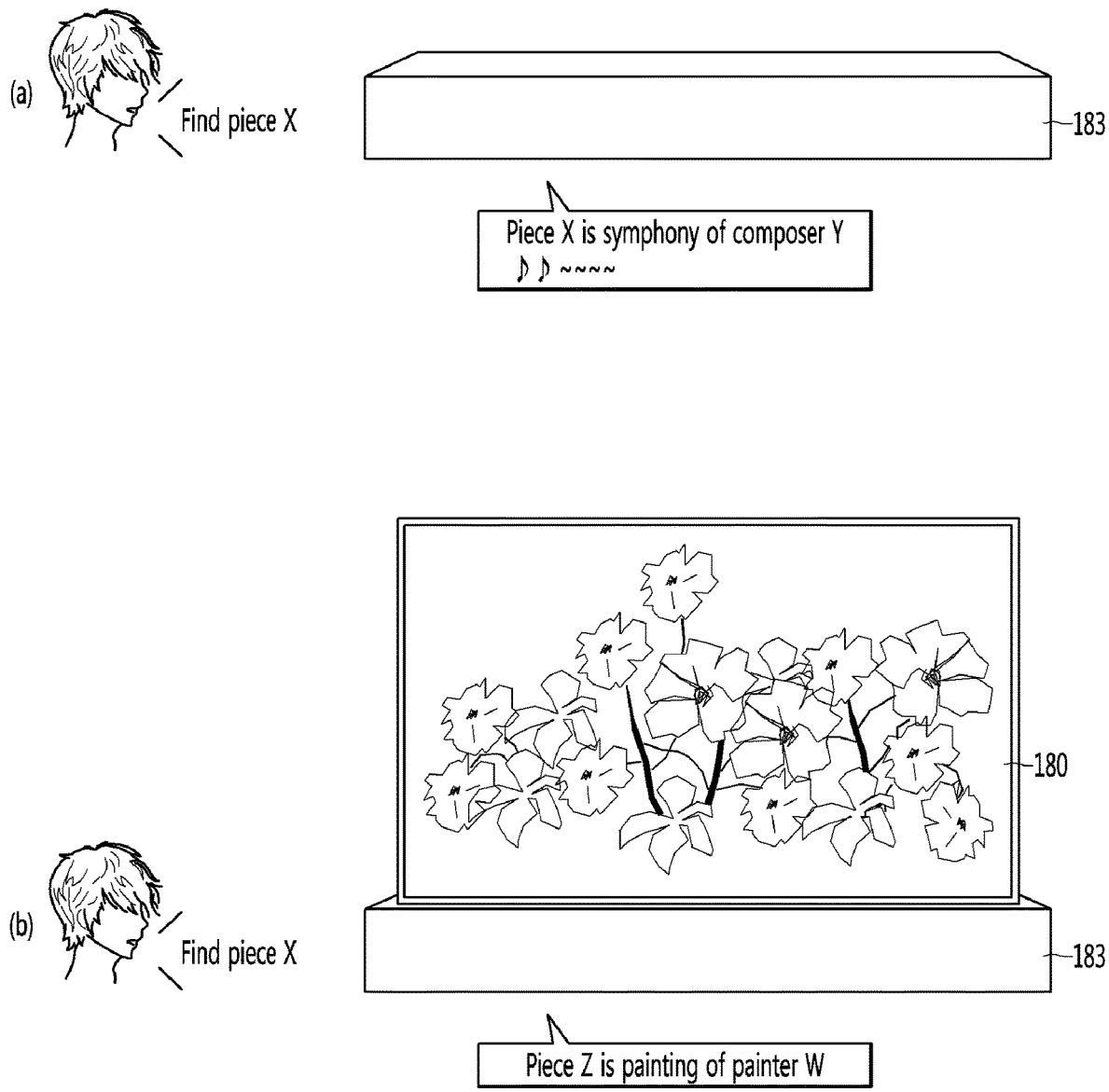
FIG. 21 is a view illustrating a fifth embodiment of a method in which a display device according to the present disclosure provides a result of a voice command differently according to a mode of a display.

FIG. 21 is a view illustrating a fifth embodiment of a method in which a display device according to the present disclosure provides a result of a voice command differently according to a mode of a display. As shown in FIG. 21, the controller 170 can receive a voice command such as "Find piece X."

As shown in (a) of FIG. 21, when the result of the voice command is music, the controller 170 can analyze that an image is not included in the result of the voice command, and provide a result of the voice command in the zero view mode. Meanwhile, as shown in (b) of FIG. 21, when the result of the voice command is a picture, the controller 170 can analyze that an image is included in the result of the voice command and provide a result of the voice command in the full view mode (or partial view mode).

According to the fifth embodiment, since the display device 100 drives the display 180 according to the result of the voice command, the result of the voice command can be accurately transferred to the user. According to a sixth embodiment, the controller 170 can adjust the drawn-out length of the display 180 according to a size of the voice command. Alternatively, the controller 170 can control the display 180 to the zero view mode, the full view mode, or the partial view mode according to the size of the voice command and then provide a result of the voice command.

For example, the controller 170 can control the roller 184 such that the display 180 is at least partially drawn out from the housing 183 if the size of the voice command is greater than or equal to a preset size, and the controller 170 can control the roller 184 such that the display 180 is entirely drawn into the housing 183 if the size of the voice command is less than the preset size. Alternatively, the controller 170 can control the display 180 to the full view mode or the partial view mode if the size of the voice command is greater than or equal to the preset size, and the controller 170 can control the display to the zero view mode and then provide the result of the voice command if the size of the voice command is less than the preset size.

Figure 22:
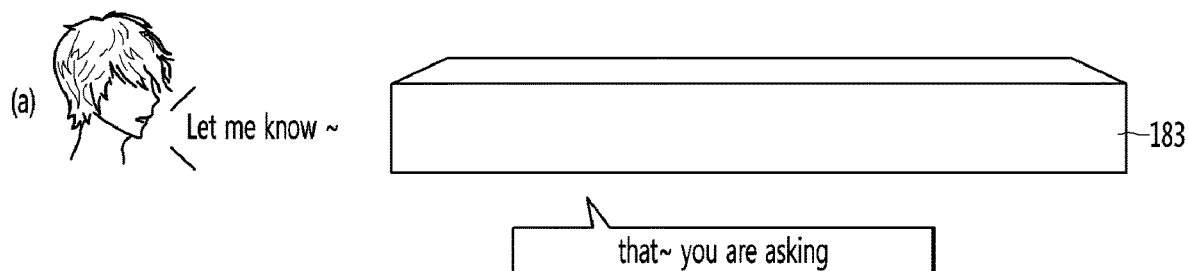
FIG. 22 is a view illustrating a sixth embodiment of a method in which a display device according to the present disclosure provides a result of a voice command differently according to a mode of a display.
Figure 22:
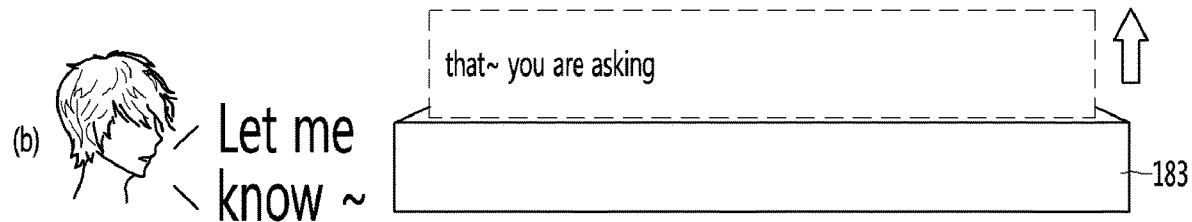

FIG. 22 is a view illustrating a sixth embodiment of a method in which a display device according to the present disclosure provides a result of a voice command differently according to a mode of a display. As shown in FIG. 22, the controller 170 can receive a voice command such as "Let me know." The controller 170 can acquire a size of the received voice command.

As shown in (a) of FIG. 22, the controller 170 can output a result of the voice command through the audio output unit 185 if the size of the voice command is less than the preset size. Specifically, when the display 180 is in the zero view mode, if the size of the voice command is less than the preset size, the controller 170 can output the result of the voice command through the audio output unit 185, while maintaining the zero view mode. However, if the size of the voice command is less than the preset size when the display 180 is in the partial view mode or the full view mode, the controller 170 can maintain the partial view mode or the full view mode or control the display 180 to the zero view mode and then output the result of the voice command through the audio output unit 185.

Meanwhile, as shown in the example of (b) of FIG. 22, the controller 170 can output the result of the voice command through the display 180 if the size of the voice command is greater than or equal to the preset size. Specifically, if the size of the voice command is greater than or equal to the preset size when the display 180 is in the zero view mode, the controller 170 can control the display 180 to the partial view mode or the full view mode and then display the result of the voice command on the display 180. However, if the size of the voice command is greater than or equal to the preset size when the display 180 is in the partial view mode or the full view mode, the controller 170 can display the result of the voice command on the display 180, while maintaining the partial view mode or the full view mode.

According to the sixth embodiment, in general, a small size of the voice command can mean that the user is located far from the display device 100, and a large size of the voice command can mean that the user is located closer to the display device 100. Accordingly, the display device 100 can estimate whether the user can view the display 180 or whether it is difficult for the user to view the display 180 according to the size of the voice command, and accordingly, the result of the voice command can be more accurately transferred to the user.

According to a seventh embodiment, the controller 170 can analyze whether a voice command is a search command for an external device, and when a search command for an external device is received, the controller 170 can control the display 180 based on the result of detecting the external device.

For example, if a voice command is a search command for an external device, the controller 170 can detect an external device connected to the display device 100, and when an external device connected to the display device 100 is not detected, the controller 170 can control the roller 185 such that the display 180 is entirely drawn into the housing 183, and also, when an external device connected to the display device 100 is detected, the controller 170 can control the roller 183 such that the display 180 is at least partially drawn out from the housing 183. Alternatively, if the voice command is a search command for an external device, the controller 170 can detect an external device connected to the display device 100, and if an external device connected to the display device 100 is not detected, the controller 170 can control the display 180 to the zero view mode, and if an external device connected to the display device 100 is detected, the controller 170 can control the display 180 to the full view mode or the partial view mode.

Figure 23:
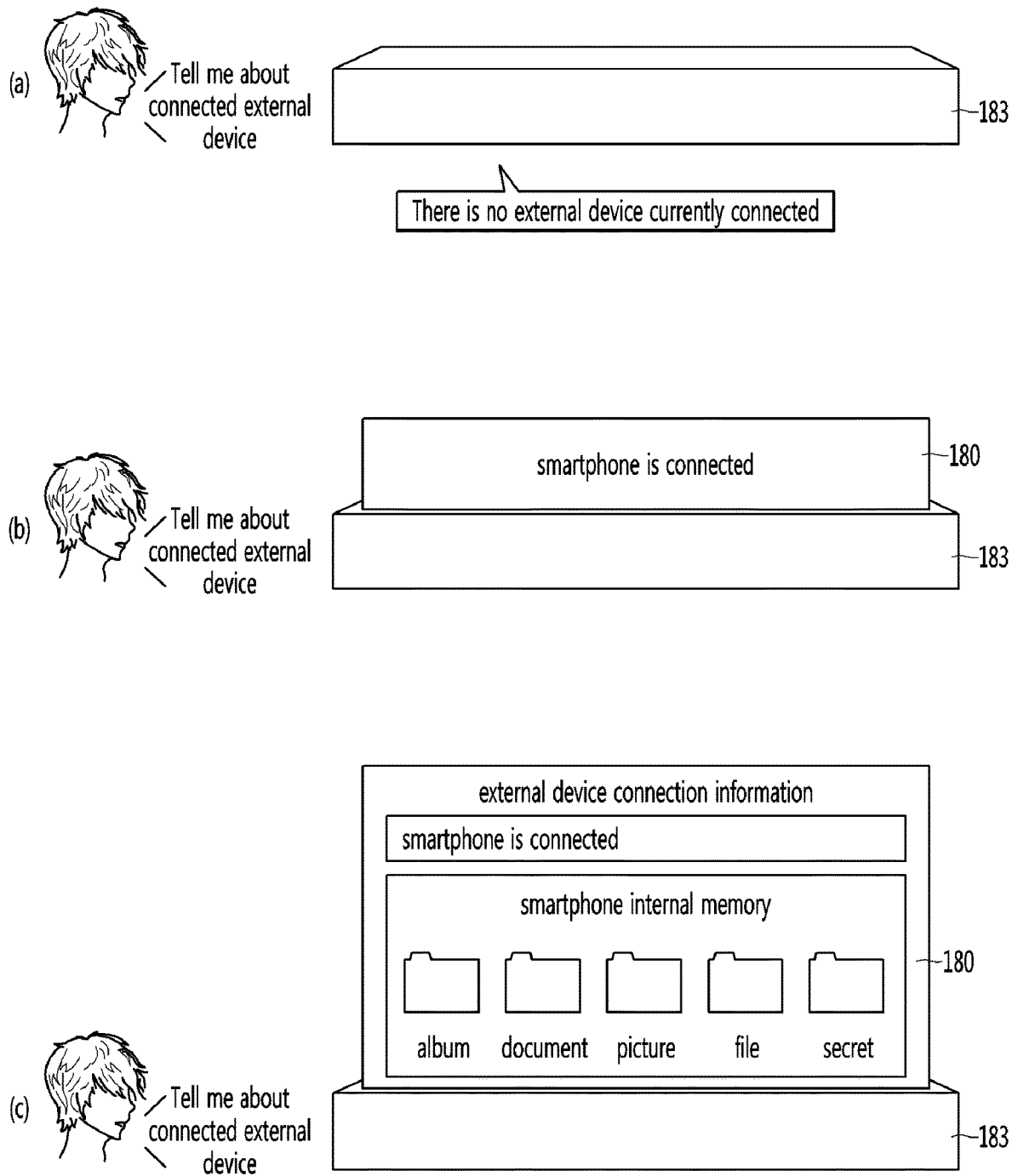
FIG. 23 is a view illustrating a seventh embodiment of a method in which a display device according to the present disclosure provides a result of a voice command differently according to a mode of a display.

FIG. 23 is a view illustrating a seventh embodiment of a method in which a display device according to the present disclosure provides a result of a voice command differently according to a mode of a display. As shown in FIG. 23, the controller 170 can receive a search command for an external device, such as "Tell me about connected external device," as a voice command. In this instance, the controller 170 can detect an external device connected to the display device 100.

If there is no external device connected to the display device 100, the controller 170 can output a message indicating a connection state of the external device through the audio output unit 185. Referring to the example shown in (a) of FIG. 23, the controller 170 can control the audio output unit 185 to output a message such as "No external device is currently connected."

If there is an external device connected to the display device 100, the controller 170 can control the display 180 to the partial view mode or the full view mode and then control the display 180 to display information of the external device connected to the display device 100. For example, the controller 170 can control the display 180 to display brief information of the external device connected to the display device 100 in the partial view mode as shown in (b) of FIG. 23 or can control the display 180 to display detailed information of the external device connected to the display device 100 in the full view mode as shown in (c) of FIG. 23. Here, the brief information of the external device can be a device name or a device type, and the detailed information of the external device can include content information included in the device as well as the device name or device type, but this is merely an example and the present disclosure is not limited thereto.

Also, as a modification of the seventh embodiment, the controller 170 can display the result of the voice command according to the drawn-out length or mode of the current display 180 when receiving a search command for the external device as a voice command. For example, if the search command for the external device is received when the display 180 is in the zero view mode, the controller 170 can output the result of detecting the external device connected to the display device 100 to the audio output unit 185.

When the display 180 receives a search command for the external device when the display 180 is in the partial view mode, the controller 170 can detect the external device connected to the display device 100 and display the result of detecting the external device connected to the display device 100 on the display 180. For example, if there is no external device connected to the display device 100, the controller 170 can output a message indicating the same on the display 180. However, if there is an external device connected to the display device 100, the controller 170 can output brief information of the connected external device on the display 180.

If the search command for the external device is received when the display 170 is in the full view mode, the controller 170 can detect the external device connected to the display device 100 and display the result of detecting the external device connected to the display device 100 on the display 180. For example, if there is no external device connected to the display device 100, the controller 170 can output a message indicating the same on the display 180. However, if there is an external device connected to the display device 100, the controller 170 can output detailed information of the connected external device on the display 180.

According to an eighth embodiment, the controller 170 can analyze whether a voice command is a connection command for an external device, and when the connection command for an external device is received, the controller 170 can perform connection to the external device and provide information on the connection to the external device to the user.

For example, the controller 170 can connect to the external device if the voice command is a connection command for the external device, output whether to connect to the external device as audio if the display is entirely drawn in the housing 183, and output information on connection to the external device on the display 180 if at least a part of the display 180 is drawn out from the housing 183. Alternatively, the controller 170 can connect to the external device if a voice command is a connection command for the external device, output whether to connect to the external device as audio if the display 180 is in the zero view mode, and output information on connection to the external device on the display 180 if the display 180 is in the partial view mode or the full view mode.

Figure 24:
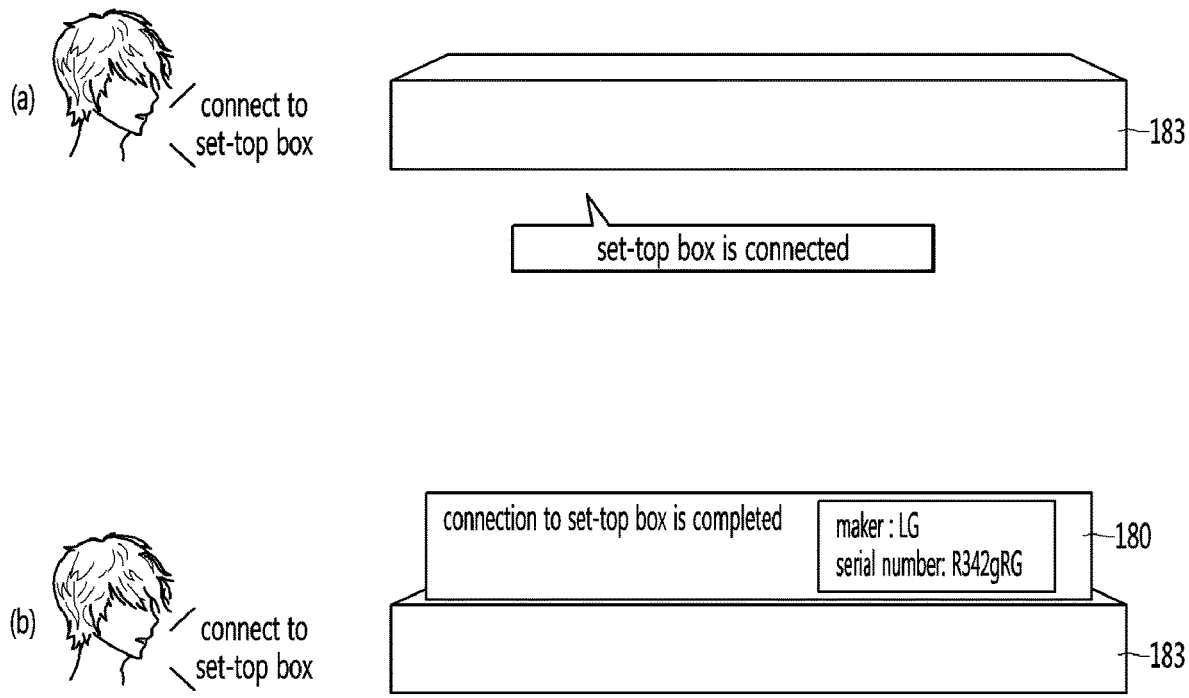
FIG. 24 is a view illustrating the eighth embodiment of a method in which a display device according to the present disclosure provides a result of a voice command differently according to a mode of a display.

FIG. 24 is a view illustrating the eighth embodiment of a method in which a display device according to the present disclosure provides a result of a voice command differently according to a mode of a display. As shown in FIG. 24, the controller 170 can receive a connection command for an external device such as "Connect to set-top box" as a voice command. In this instance, the controller 170 can connect to an external device according to the voice command.

When connected to the external device in the zero view mode, the controller 170 can output a message indicating the connection to the external device through the audio output unit 185 as shown in (a) of FIG. 24. When connected to the external device in the partial view mode (or the full view mode), the controller 170 can output information on the connection to the external device and information of the connected external device on the display 180 as shown in (b) of FIG. 24.

According to a ninth embodiment, when receiving a voice command, the controller 170 can set a search range differently according to a mode of the display 180. For example, the controller 170 can set one search domain for a voice command if at least a part of the display 180 is drawn out from the housing 183, and set a plurality of search domains for the voice command if the display 180 is entirely drawn out from the housing 183. Alternatively, the controller 170 can set one search domain for the voice command if the display 180 is in the zero view mode or the partial view mode, and set two or more search domains for the voice command if the display 180 is in the full view mode. Here, the search domain can refer to the storage 140 of the display device 100, an application, a web page, or the like.

Figure 25:
FIG. 25 is a view illustrating a ninth embodiment of a method in which a display device according to the present disclosure provides a result of a voice command differently according to a mode of a display.
Figure 25:
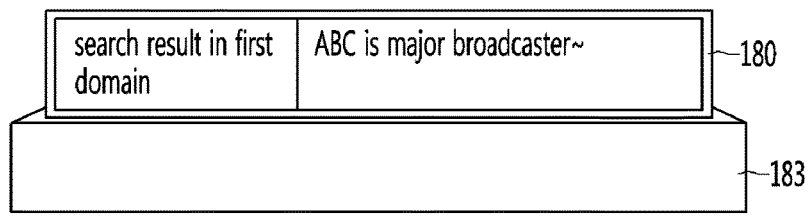
Figure 25:
Figure 25:
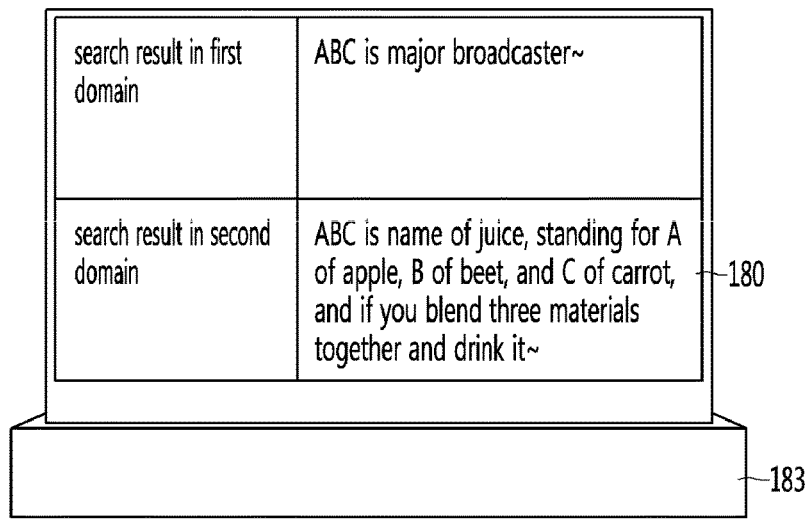

FIG. 25 is a view illustrating a ninth embodiment of a method in which a display device according to the present disclosure provides a result of a voice command differently according to a mode of a display. When the display 180 is in the zero view mode, the controller 170 can set one search domain, perform searching on a voice command in the set search domain, and then output a search result to the audio output unit 185.

If the display 180 is the partial view mode, the controller 170 can set one search domain, perform searching on the voice command in the set search domain, and then display a search result on the display 180. If the display 180 is in the full view mode, the controller 170 can set two or more search domains, perform searching on the voice command in each of the set search domains, and then display a search result on the display 180.

According to the example shown in (a) of FIG. 25, the display 180 outputs a search result for one search domain in the partial view mode, and according to the example shown in (b) FIG. 25, the display 180 outputs a search result on two search domains in the full view mode.

As described above, according to the ninth embodiment, the display device 100 can display various search results based on the available size of the search result of the voice command, thereby providing more abundant results of the voice command to the user. According to a tenth embodiment, the controller 170 can differently control the drawn-out length or mode of the display 180 for providing a result of a voice command according to a question format of the voice command.

For example, if the question format of the voice command does not limit a form of the result, such as "Find~", the controller 170 can provide a result of the voice command, while maintaining the mode of the current display 180. Can provide results. However, if the question format of the voice command limits a form of the result to a visual form such as "Show me~", the controller 170 can control the display 180 to the partial view mode or the full view mode and then provide the result of voice command.

Figure 26:
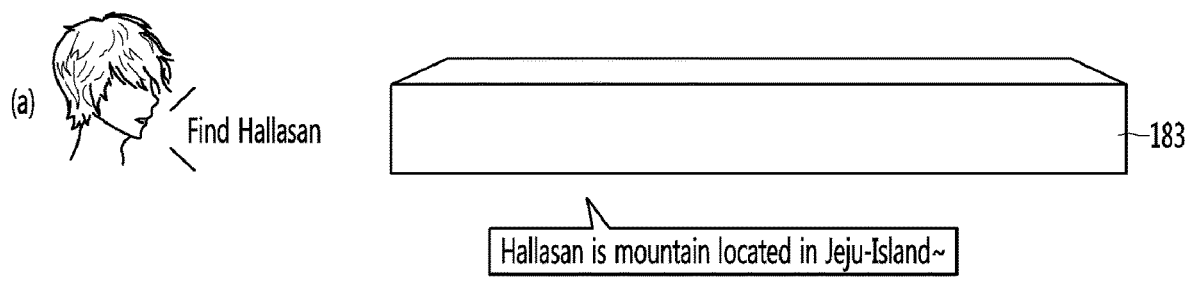
FIG. 26 is a view illustrating a tenth embodiment of a method in which a display device according to the present disclosure provides a result of a voice command differently according to a mode of a display.
Figure 26:
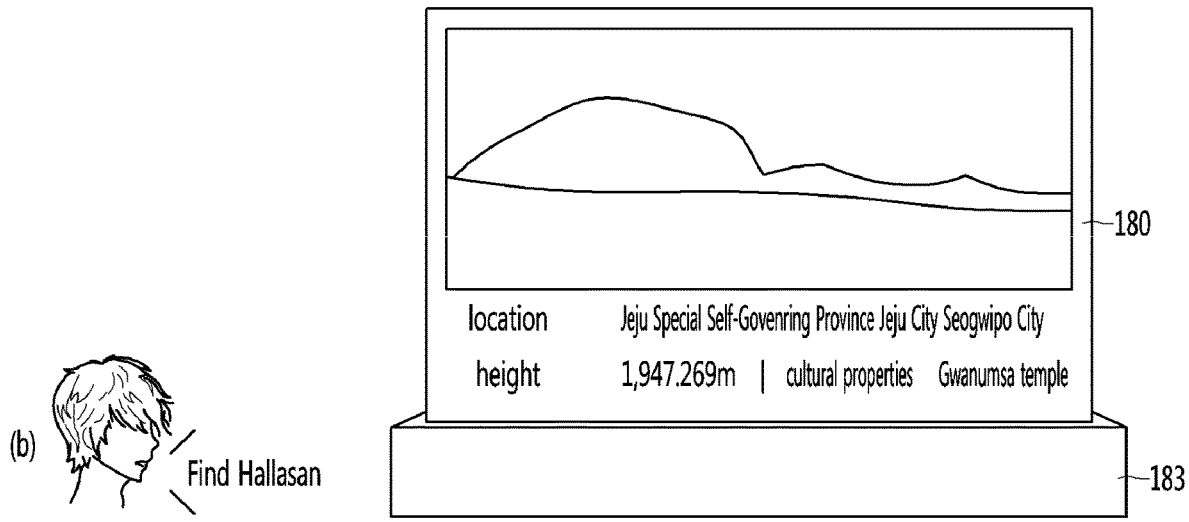

FIG. 26 is a view illustrating a tenth embodiment of a method in which a display device according to the present disclosure provides a result of a voice command differently according to a mode of a display. According to the example shown in (a) of FIG. 26, when a voice command such as "Find Hallasan" is received, the controller 170 can output a search result for the "Hallasan" as a search target through the audio output unit 185. Meanwhile, according to the example shown in (b) of FIG. 26, when a voice command such as "Show me Hallasan" is received, the controller 170 can control the display 180 to the full view mode (or partial view mode) and then output the search result for the search target "Hallasan" on the display 180.

According to the tenth embodiment, the display device 100 can provide the result of the voice command corresponding to the intent of the user. In addition to the embodiments described above, the controller 170 can differently control a method of providing a result of a voice command based on at least one of a mode of the display 180, a voice command, or a result of the voice command.

According to an eleventh embodiment, the controller 170 can obtain a result of a voice command, adjust a drawn-out length of the display 180 according to the amount of data corresponding to the result of the voice command, and then output the result of the voice command. According to a twelfth embodiment, when a voice command is received, the controller 170 can request as to how to receive a result of the voice command (for example, "Tell me display mode for receiving result of voice command, etc.) from the user, adjust the mode of the display 180 based on a user response, and then output the result of the voice command.

According to a thirteenth embodiment, when a voice command for a specific content is received, if the corresponding content is currently being broadcast, the controller 170 can adjust the display 180 to the full view mode and display the corresponding content, and if the content is not being broadcast, the controller 170 can adjust the display 180 to zero view mode or partial view mode, and then output information on the corresponding content.

According to a fourteenth embodiment, if a result of a voice command received in the partial view mode or the full view mode can be provided only as an audio signal (for example, the voice command is "Play song", "Read book", etc.), the controller 170 can control the display 180 to the zero view mode and output the result of the voice command. In this instance, unnecessary power consumption can be reduced.

Figure 27:
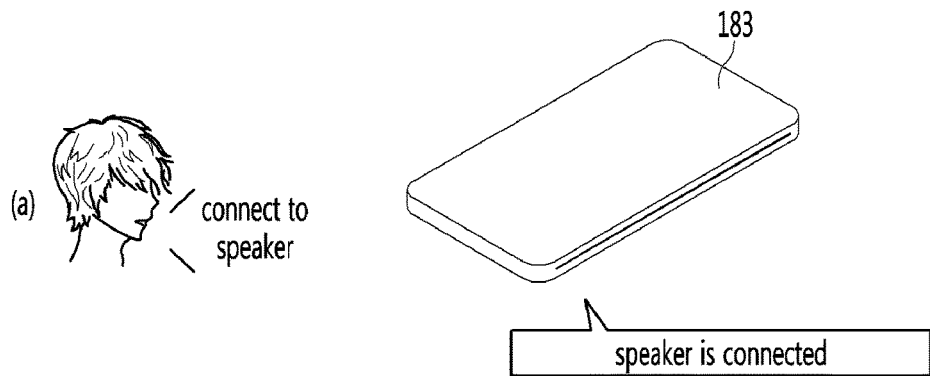
FIG. 27 is a view illustrating a method in which a display device having a shape of a mobile terminal according to the disclosure differently controls a result of a voice command differently according to a drawn-out length of a display.
Figure 27:
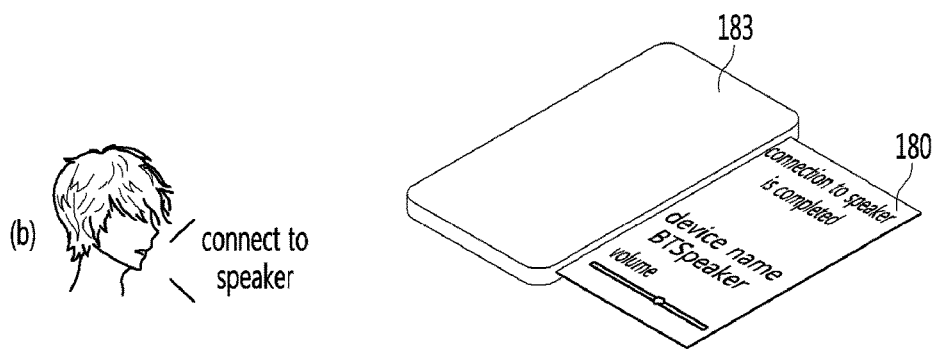
Figure 27:
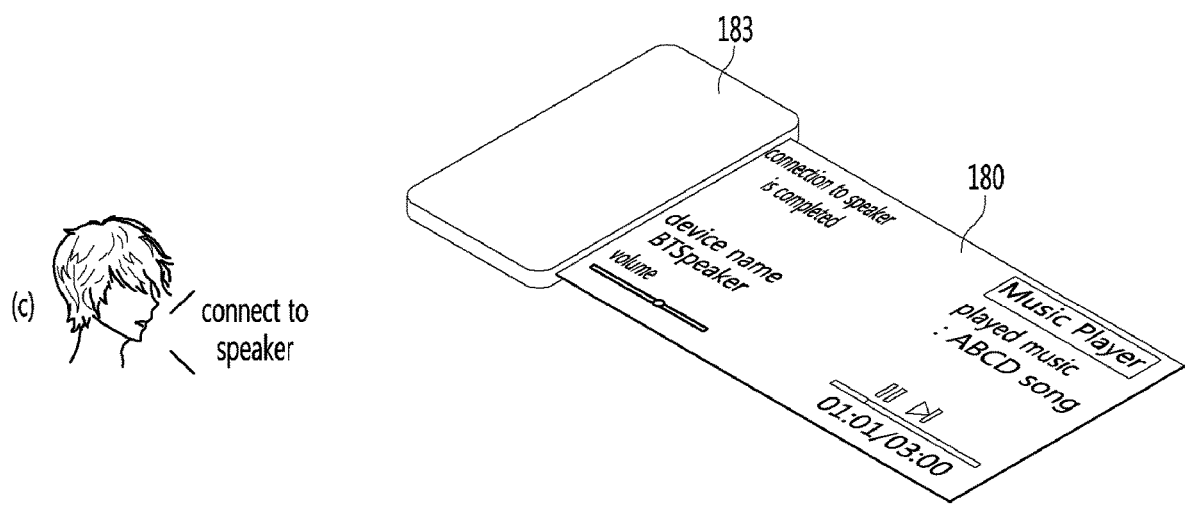

FIG. 27 is a view illustrating a method in which a display device having a shape of a mobile terminal according to the disclosure differently controls a result of a voice command differently according to a drawn-out length of a display. When a voice command such as "Connect to speaker" is received, as shown in (a) of FIG. 27, if the display 180 is not drawn out from the housing 183, a result of the voice command (for example, "the speaker is connected") can be output as audio.

When the voice command such as "Connect to speaker" is received, as shown in (b) of FIG. 27, the controller 170 can output a result of the voice command on the display 180 when the display 180 is only partially drawn out from the housing 183. For example, the display 180 can display a message indicating whether to connect to the speaker and information on the connected speaker (for example, device information or volume information).

When the voice command such as "Connect to speaker" is received, as shown in (c) of FIG. 27, the controller 170 can output a result of the voice command on the display 180 if the display 180 is maximally drawn out from the housing 183, and here, the amount of the result of the voice command can be larger than the amount of the result of the voice command output when only a part of the display 180 is drawn out. For example, the display 180 can display a message indicating whether to connect to the speaker, information on the connected speaker (for example, device information or volume information), and application information running in connection with the connected speaker.

The method of operating the display device 100 illustrated in FIGS. 13 to 19 and FIGS. 21 to 26 can be applied to the display device 100 having the shape of a mobile terminal illustrated in FIGS. 9 to 11, and conversely, the method of operating the display device 100 illustrated in FIG. 27 can be applied to the display device 100 having the shape of a TV illustrated in FIG. 8. That is, all the embodiments described herein are merely examples for convenience of description and can be applied to all display devices having a rollable display.

As described above, the display device 100 controls the method of providing the result of the voice command based on at least one of the drawn-out length (or mode) of the display 180, the voice command, or the result of the voice command, whereby a time required for providing the result of the voice command to the user can be minimized and the information required for the user can be provided more accurately.

The above description is merely illustrative of the technical idea of the present disclosure, and various modifications and changes can be made thereto by those skilled in the art without departing from the essential characteristics of the present disclosure. Therefore, the embodiments of the present disclosure are not intended to limit the technical spirit of the present disclosure but to illustrate the technical idea of the present disclosure, and the technical spirit of the present disclosure is not limited by these embodiments.

The scope of protection of the present disclosure should be interpreted by the appending claims, and all technical ideas within the scope of equivalents should be construed as falling within the scope of the present disclosure.

What is claimed is:

1. A display device comprising:
    a housing;
    a rotatable roller accommodated in the housing;
    a rollable display adjusted in a drawn-out length from the housing according to rotation of the roller; and
    a controller configured to:
    receive an input of a voice command, and
    vary a method of outputting a result of the voice command according to the drawn-out length of the rollable display,
    wherein the controller configured to output the result of the voice command differently according to the drawn-out length of the rollable display even for the same voice command.

2. The display device of claim 1, wherein the controller is configured to:
    output the result of the voice command as audio when the rollable display is not drawn out from the housing, and
    display the result of the voice command on the rollable display when at least a part of the rollable display is drawn out from the housing.

3. The display device of claim 2, wherein the controller is configured to differently adjust an amount of the result of the voice command output on the rollable display according to the drawn-out length of the rollable display when at least a part of the rollable display is drawn out from the housing.

4. The display device of claim 3, wherein the controller is configured to:
    display the result of the voice command on the rollable display when the drawn-out length is equal to or greater than a preset length, and
    display summary information of the result of the voice command on the rollable display when the drawn-out length is less than the preset length.

5. The display device of claim 1, wherein the controller is configured to receive a selection whether to display the result of the voice command to a screen on the rollable display after outputting the result of the voice command as audio, when the rollable display is not drawn out from the housing.

6. The display device of claim 5, wherein the controller is configured to control the roller such that the rollable display is drawn out from the housing, when a command for displaying the result of the voice command to the screen is received.

7. The display device of claim 1, wherein the controller is configured to control the roller such that the rollable display is drawn out from the housing, while outputting the result of the voice command as audio, when the rollable display is not drawn out from the housing.

8. The display device of claim 1, wherein the controller is configured to control the roller such that the rollable display is further drawn out from the housing, while displaying summary information of the result of the voice command on the rollable display, when the drawn-out length is less than a preset length.

9. The display device of claim 8, wherein the controller is further configured to display information other than the summary information on the rollable display, while the rollable display is being further drawn out.

10. The display device of claim 1, wherein the controller is configured to adjust the drawn-out length of the rollable display according to the result of the voice command.

11. The display device of claim 10, wherein the controller is configured to:
control the roller such that the rollable display is at least partially drawn out from the housing when an image is included in the result of the voice command, and
control the roller such that the rollable display is entirely drawn into the housing when an image is not included in the result of the voice command.

12. The display device of claim 1, wherein the controller is configured to adjust the drawn-out length of the rollable display according to a size of the voice command.

13. The display device of claim 12, wherein the controller is configured to:
control the roller such that the rollable display is at least partially drawn out from the housing when the size of the voice command is equal to or greater than a preset size, and
control the roller such that the rollable display is entirely drawn into the housing when the size of the voice command is less than the preset size.

14. The display device of claim 1, wherein the controller is configured to:
detect an external device connected to the display device when the voice command is a search command for the external device,
control the roller such that the rollable display is entirely drawn into the housing when the external device is not detected, and
control the roller such that the rollable display is at least partially drawn out from the housing when the external device is detected.

15. The display device of claim 1, wherein the controller is configured to:
connect to an external device when the voice command is a connection command for the external device,
output information on the connection to the external device as audio when the rollable display is entirely drawn into the housing, and
display information on the connection to the external device on the rollable display when at least a part of the rollable display is drawn out from the housing.

16. The display device of claim 1, wherein the controller is configured to:
set one search domain for the voice command when at least a part of the rollable display is drawn out from the housing, and
set two or more search domains for the voice command when the rollable display is entirely drawn out from the housing.

17. The display device of claim 1, wherein the controller is configured to differently control the drawn-out length of the rollable display for providing the result of the voice command according to a question format of the voice command.

18. The display device of claim 1, wherein the controller is configured to:
differently control the result of the voice command according to a mode of the rollable display when the voice command is received, and
wherein the mode of the rollable display comprises a zero view mode in which the rollable display operates in a state of being entirely drawn in the housing, a full view mode in which the rollable display operates in a state of being maximally drawn out from the housing, and a partial view mode in which the rollable display operates in a state of being drawn out from the housing to be shorter than in the full view mode.

19. The display device of claim 18, wherein the controller is configured to:
output, as audio, a search result corresponding to the voice command when the rollable display is in the zero view mode,
display the search result corresponding to the voice command on the rollable display when the rollable display is in the full view mode, and
display summary information of the search result corresponding to the voice command on the rollable display when the rollable display is in the partial view mode.

20. The display device of claim 1, wherein the controller is configured to differently control the method of providing the result of the voice command according to the drawn-out length by outputting audio data or by displaying the result on the rollable display.

* * * * *